(12) United States Patent
Takeuchi et al.

(10) Patent No.: US 7,759,984 B2
(45) Date of Patent: Jul. 20, 2010

(54) COMPARING CIRCUIT AND INFRARED RECEIVER

(75) Inventors: Noboru Takeuchi, Tenri (JP); Takahiro Inoue, Katsuragi (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 713 days.

(21) Appl. No.: 11/785,214

(22) Filed: Apr. 16, 2007

(65) Prior Publication Data

US 2007/0297812 A1    Dec. 27, 2007

(30) Foreign Application Priority Data

Jun. 21, 2006    (JP) .............................. 2006-171807

(51) Int. Cl.
*H03K 5/22* (2006.01)
(52) U.S. Cl. .......................................... 327/77; 327/74
(58) Field of Classification Search ................... 327/74, 327/75, 77
See application file for complete search history.

(56) References Cited

U.S. PATENT DOCUMENTS

| | | | |
|---|---|---|---|
| 4,988,895 A | | 1/1991 | Kihara et al. |
| 5,614,857 A | * | 3/1997 | Lim et al. ................... 327/205 |
| 6,191,624 B1 | * | 2/2001 | Matsuya ....................... 327/77 |
| 6,693,466 B2 | * | 2/2004 | Inoue et al. ................... 327/72 |
| 7,336,107 B2 | * | 2/2008 | Takekawa et al. ............ 327/77 |
| 7,535,263 B2 | * | 5/2009 | Nakamura .................... 327/58 |

2003/0112037 A1    6/2003    Inoue et al.

FOREIGN PATENT DOCUMENTS

| JP | 10-187862 A | 7/1998 |
|---|---|---|
| JP | 2000-36730 A | 2/2000 |

\* cited by examiner

*Primary Examiner*—Hai L Nguyen
(74) *Attorney, Agent, or Firm*—Birch, Stewart, Kolasch & Birch, LLP

(57) ABSTRACT

A comparing circuit of the present invention includes: a charging and discharging circuit to charge a capacitor with charging current and discharge the capacitor with discharging current alternately in response to a switch of an input pulse signal; a comparator circuit to compare a capacitor-voltage (Csig) of the capacitor with a first threshold voltage (Vth1) and the capacitor-voltage (Csig) with a second threshold voltage (Vth2), which is higher than the first threshold voltage, to generate a pulse signal responsive to a result of this comparison, and to supply an output-signal generating circuit with the pulse signal to switch a level of an output pulse-signal; and a logical operation circuit to adjust a value of the charging current and a value of the discharging current by generating a signal that is based on the pulse signal and is to adjust the value of the charging current and the value of the discharging current of the charging and discharging circuit and supplying the charging and discharging circuit with the signal thus generated. This configuration makes it possible for the comparing circuit to maintain capability of preventing errors, and at the same time, improve in capability of outputting a pulse having a same period as that of an input pulse having a short pause period.

18 Claims, 27 Drawing Sheets

FIG. 4

TRUE VALUES OF SR LATCH CIRCUIT AND OUTPUT CIRCUIT

| Csig | S | R | Q | -Q | Vout |
|---|---|---|---|---|---|
| INITIAL POINT | 1 | 0 | 0 | 1 | Hi |
| POINT B | 1 | 1 | 0 | 1 | Hi |
| POINT C | 0 | 1 | 1 | 0 | Low |
| POINT F | 1 | 1 | 1 | 0 | Low |
| POINT G | 1 | 0 | 0 | 1 | Hi |

(- Q INDICATES NEGATIVE LOGIC OF Q)

[Toff > t3]

[t2 < Toff < t3]

(NO DEVIATION OCCURS IN PERIODS)

FIG. 7

TRUE VALUES OF SR LATCH CIRCUIT AND OUTPUT CIRCUIT

| Csig | S | R | Q | -Q | Vout | |
|---|---|---|---|---|---|---|
| INITIAL POINT | 1 | 0 | 0 | 1 | Hi | |
| POINT A | 1 | 1 | 0 | 1 | Hi | |
| POINT B | 0 | 1 | 1 | 0 | Low | |
| POINT C | 1 | 1 | 1 | 0 | Low | |
| POINT D | 0 | 1 | 1 | 0 | Low | Q DOES NOT REVERSE |
| POINT E | 1 | 1 | 1 | 0 | Low | |
| POINT F | 1 | 0 | 0 | 1 | Hi | |

(- Q INDICATES NEGATIVE LOGIC OF Q)

CURRENT MIRROR CIRCUIT (CURRENT RATIO 1:m, *m = 5)

[Toff > t3]

[t2 < Toff < t3]

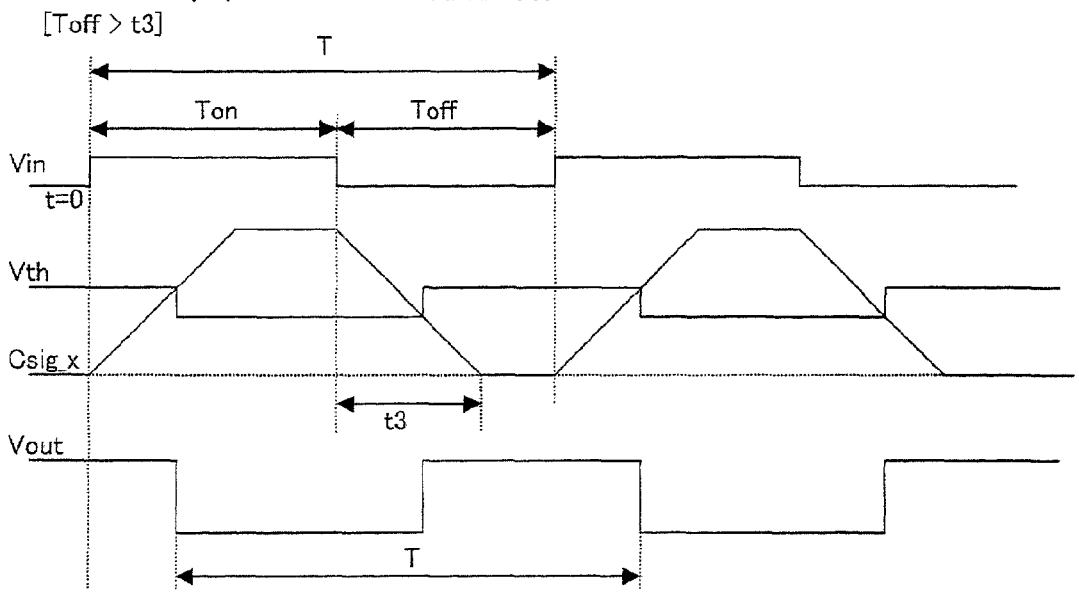
FIG. 27 (a) CONVENTIONAL ART
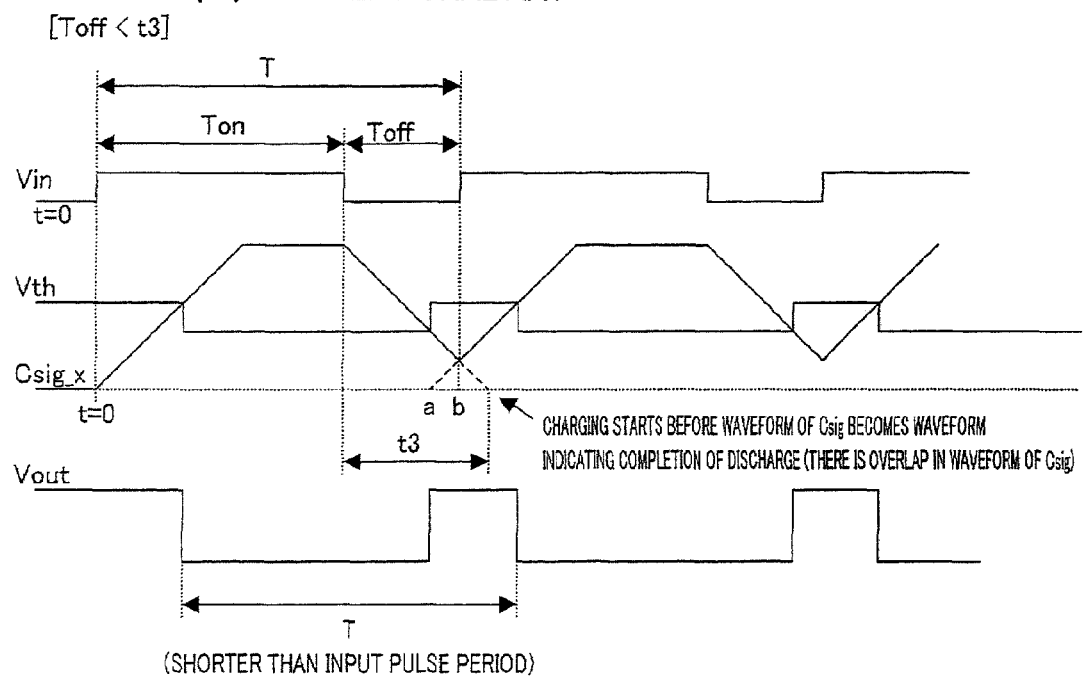
FIG. 27 (b) CONVENTIONAL ART

COMPARING CIRCUIT AND INFRARED RECEIVER

This Nonprovisional application claims priority under 35 U.S.C. §119(a) on Patent Application No. 171807/2006 filed in Japan on Jun. 21, 2006, the entire contents of which are hereby incorporated by reference.

FIELD OF THE INVENTION

The present invention relates to a comparing circuit, and particularly, relates to a comparing circuit including a hysteresis comparator circuit in an infrared receiver built in an IC, and a comparing circuit including a hysteresis comparator circuit in a demodulator of signals including carriers.

BACKGROUND OF THE INVENTION

In recent years, devices employing infrared communications means have been used widely. An example of such devices is an infrared communication receiver such as a remote control of home appliances. Generally, to prevent errors in circuits, an infrared communication receiver includes a hysteresis comparator circuit in its output circuit. The hysteresis comparator circuit prevents errors in circuits, such as chattering.

Examples of this infrared communications means include an IrDA (Infrared Data Association) receiving device (infrared receiving device) and an infrared remote control receiving device. Table 1 below shows specifications of the devices, including communication rates, pulse widths, and pulse periods.

TABLE 1

|   | COMMUNICATION RATE | PULSE WIDTH | T |
|---|---|---|---|
| IrDA RECEIVING DEVICE | 4 Mbps (FIR) | (¼) * T | 500 nsec |
|  | 1.152 Mbps (MIR) | (¼) * T | 868 nsec |
|  | 2.4 kbps-115.2 kbps (SIR) | (3/16) * T | 8.68 usec-104 usec |
| INFRARED REMOTE CONTROL RECEIVING DEVICE | 1 kbps OR BELOW | DIFFER DEPENDING ON TRANSMISSION CODE | DIFFER DEPENDING ON TRANSMISSION CODE |

Meanwhile, infrared receiving devices generally have a problem that pulse widths fluctuate, depending on receiving distances. It depends on receiving distances whether or not the specifications for the pulse widths are satisfied. When the specifications are not satisfied, communication errors occur. Therefore, there have been demands for an infrared receiver that includes a hysteresis comparator circuit so as to maintain conventional capability of preventing errors, and at the same time, to allow output-pulse widths to be stable.

In recent years, an increasing number of multimedia devices such as wireless keyboards have been including an infrared remote control system utilizing transmission codes of short periods and short pulse widths to speed up transmission and to drive at low power-consumption. This gives rise to increasing demands for development of infrared receivers capable of receiving the transmission codes of short periods and short pulse widths.

Hysteresis comparator circuits responsive to such demands are disclosed in, for example, Japanese Utility Model Application Publication No. 132127/1989 (Jitsukaihei 1-132127) (published on Sep. 7, 1989) and Japanese Unexamined Patent Publication No. 152509/2003 (published on May 23, 2003). The following describes, as a conventional circuit, a comparing circuit 2000 employing the hysteresis comparator circuit disclosed in the publications above, with reference to FIGS. 23 to 25.

FIG. 23 is a circuit diagram showing an exemplary configuration of the comparing circuit 2000 employing a conventional hysteresis comparator circuit. FIG. 24 is a circuit diagram showing an exemplary and concrete configuration of a hysteresis comparator circuit 2200 in the comparing circuit 2000. FIG. 25 shows waveforms in operations of the comparing circuit 2000.

As shown in FIG. 23, the comparing circuit 2000 includes: a charging and discharging circuit 2100 to charge and discharge a capacitor 2109 (capacitance Cx); the hysteresis comparator circuit 2200; an output circuit 2300; an input section 2001 via which a signal is supplied to the charging and discharging circuit 2100; and an output section 2002 via which an output signal of the output circuit 2300 is output.

In the figures, "MN" indicates an N-channel MOSFET, and "MP" indicates a P-channel MOSFET. When a voltage equal to or higher than a threshold voltage (Vth) is applied across a gate and a source, conduction is made between a drain and the source, and current flows. Hereinafter, the voltage applied across the gate and the source will be abbreviated as Vgs. Further, "ON" indicates that conduction is made between the drain and the source, and "OFF" indicates that conduction is made between the drain and the source.

The following describes basic operations, and configuration, of the charging and discharging circuit 2100, with reference to FIGS. 23 and 25.

In the charging and discharging circuit 2100, when a pulse signal, i.e. an input voltage (Vin), is fed into the input section 2001, a voltage Vgs lower than the threshold voltage is applied to the MN2105 if Vin=Low. Therefore, the MN2105 becomes MN2105=OFF. Thus, the constant-current Iy supplied from the current source 2108 is mirrored by the current mirror formed by the MN2106 and the MN2107, and is drawn from the capacitor 2109, whereby the capacitor 2109 is discharged.

At this time, the MP2101 becomes MP2101=ON. Therefore, the constant-current Ix supplied from the current source 2104 flows through a path from the Vcc to the GND via the MP2101. Thus, no current flows through the MP2102 and the MP2103. Accordingly, when Vin=Low, the capacitor 2109 is discharged.

When Vin=High, the MP2101 becomes MP2101=OFF, and the MN2105 becomes MN2105=ON. When MP2101=OFF, the constant-current Ix is mirrored by the current mirror formed by the MP2102 and the MP2103, and flows through the capacitor 2109, whereby the capacitor 2109 is charged. Further, when the MN2105 is MN2105=ON, the constant-current Iy flows through a path from the Vcc to the GND via the MN2105. Thus, no current flows through the MN2106 and the MN2107. Accordingly, when Vin=High, the capacitor 2109 is charged.

A capacitor voltage (Csig_x), which indicates a voltage of the capacitor 2109, changes according to whether Vin=High or Vin=Low. In other words, the capacitor voltage Csig_x changes according to whether it is charging or discharging.

As shown in FIG. 25, at point A where Vin=High, charging the capacitor 2109 starts. Thus, the capacitor voltage Csig_x rises. From point A to point C, the capacitor voltage Csig_x rises at a fixed time constant. At point C where the capacitor voltage Csig_x rises to Vcc, charging reaches saturation, and the capacitor voltage Csig_x is fixed. At point D where Vin=Low, discharging the capacitor 2109 starts. Thus, the capacitor voltage Csig_x drops. From point D to point F, the capacitor voltage Csig_x drops at a fixed time constant. At point F where the capacitor voltage Csig_x drops to GND (0V), discharging completes, and the capacitor voltage Csig_x is fixed.

The following describes basic operations, and configurations, of the hysteresis comparator circuit 2200 and the output circuit 2300, with reference to FIGS. 23 to 25. The output circuit 2300 is connected to an output end of the hysteresis comparator circuit 2200

As shown in FIG. 23, the hysteresis comparator circuit 2200 includes a comparator circuit section 2201 and a reference power-source 2202. The reference power-source 2202 generates a hysteresis threshold voltage (Vth_his) has a hysteresis characteristic. The hysteresis comparator circuit 2200 compares the capacitor voltage Csig_x of the charging and discharging circuit 2100 with the hysteresis threshold voltage Vth_his.

Specifically, as shown in FIG. 24, the hysteresis comparator circuit 2200 receives the capacitor voltage Csig_x as an input voltage (+in), and outputs an output current (Iout) responsive to a result of comparison of the capacitor voltage Csig_x with the hysteresis threshold voltage Vth_his. At this time, the value of the hysteresis threshold voltage Vth_his changes on the basis of the result of comparison. This is discussed in the following description.

(i) Case in Which +in<Vth_His

The constant-current Iw supplied from the current source 2220 flows through the MN2211, is mirrored by the current mirror formed by the MP2213 and the MP2214, and flows through the resistor 2217 (resistance Ry) and the resistor 2216 (resistance Rx). Accordingly, the hysteresis threshold voltage Vth_his is expressed by Equation (1) below $$Vth\_his = Vth\_H \qquad \text{Equation (1)}$$
$$= Rx \times Iv + (Rx + Ry) \times Iw$$

where, "H" in "Vth_H" indicates High.

At this time, no current flows through the MN2212. Thus, Iout=0.

(ii) Case in Which +in>Vth_His

The constant-current Iw supplied from the current source 2220 flows through the MN2212. Thus, a voltage drop of Rz×Iw occurs in the R2218 (resistance Rz). Therefore, a voltage equal to or higher than the threshold voltage is applied across the gate and the source of the MP2215. As a result, the MP2215 becomes ON, and the output current Iout is output. At this time, no current flows through the MN2211. Accordingly, the hysteresis threshold voltage Vth_his is expressed by Equation (2) below $$Vth\_his = Vth\_L \qquad \text{Equation (2)}$$
$$= Rx \times Iv$$

(where "L" in "Vth_L" indicates Low).

Accordingly, from cases (i) and (ii) above, the hysteresis voltage range is $$Vhis = Vth\_H - Vth\_L \qquad \text{Equation (3)}$$
$$= (Rx + Ry) \times Iw.$$

In the output circuit 2300, in case (i) above, Iout=0, and the MN2301 and the MN2302 become OFF. Therefore, the output voltage (Vout) becomes High (=Vcc). In case (ii) above, on the other hand, the output current Iout flows, and the MN2301 and the MN2302 become ON. Therefore, the output voltage Vout becomes Low (=GND).

The following describes fluctuations in the output voltage Vout when Vin=High and when Vin=Low, with reference to FIG. 25.

As shown in FIG. 25, Csig_x<Vth_his when the capacitor voltage Csig_x is at point A. Therefore, the hysteresis threshold voltage Vth_his becomes Vth_H. Thus, Vout=High. When charged to point B, the capacitor voltage Csig_x becomes Csig_x>Vth_H. Therefore, the hysteresis threshold voltage Vth_his drops to Vth_L. Thus, Vout=Low. When discharged to point E, the capacitor voltage Csig_x becomes Csig_x<Vth_his. Therefore, the hysteresis threshold voltage Vth_his rises to Vth_H. Thus, the output voltage Vout becomes Vout=High.

In FIG. 25, the pulse width is indicated as pw, a delay time in a response from the time when the input voltage Vin rises to High to the time when the output voltage Vout drops to Low is indicated as t1, a delay time in a response from the time when the input voltage Vin drops to Low to the time when the output voltage Vout rises to High is indicated as t2, and a period from the time when the input voltage Vin drops to Low and to the time when the capacitor voltage Csig_x is discharged completely to Low is indicated as t3. The capacitor 2109 is charged by the constant-current Ix shown in FIG. 23, and discharged by the constant-current Iy also shown in FIG. 23. The times t1 to t3 are expressed by Equations (4) to (6) below, respectively $$t1 = Cx \times (Vth\_H - 0) / Ix \qquad \text{Equation (4)}$$
$$= Cx \times Vth\_H / Ix$$
$$t2 = Cx \times (Vcc - Vth\_L) / Iy \qquad \text{Equation (5)}$$
$$t3 = Cx \times (Vcc - 0) / Iy \qquad \text{Equation (6)}$$
$$= Cx \times Vcc / Iy.$$

The following describes countermeasures against errors such as chattering in the comparing circuit 2000, with reference to FIG. 26. FIG. 26 shows waveforms in operations of the comparing circuit 2000 at the time when errors occur.

As shown in FIG. 26, the capacitor voltage Csig_x discharges at a time constant t/V=Cx/Iy even when a pulse of the input pulse Vin splits (y in the figure) due to noise or the like. Thus, the capacitor voltage Csig_x does not become the hysteresis threshold voltage Vth_his or lower rapidly. Further, the hysteresis voltage range Vhis of Equation (3) is given to the hysteresis threshold voltage Vth_his so that the output voltage Vout is less likely to be involved with errors.

In the comparing circuit 2000, however, the capacitor voltage Csig_x discharges at the time constant t/V=Cx/Iy to prevent errors such as chattering. Therefore, a period of time (t3) for the capacitor voltage Csig_x to be discharged completely from the High-level to the Low-level is long. Thus, there is a problem that a period (T) of a first pulse of the output voltage Vout becomes short if a period (Toff) in which the pulse of the input voltage Vin is Low is shorter than the time t3. This is discussed in the following description, with reference to FIG. 27.

FIG. 27(a) shows waveforms in operations of the comparing circuit 2000 at the time when Toff>t3. FIG. 27(b) shows waveforms in operations of the comparing circuit 2000 at the time when Toff<t3. In the figures, "T" indicates a pulse period, "Ton" indicates a period in which the pulse is High, and "Toff" indicates a period in which the pulse is Low (pause period). The input voltage Vin having a pulse of a period T (Ton+Toff) is fed continuously from time t=0.

As shown in FIG. 27(a), when Toff>t3, the capacitor voltage Csig_x discharges completely to Low before a second pulse is fed. Thus, the period of the output voltage Vout is normal.

As shown in FIG. 27(b), when Toff<t3, a second pulse of the input voltage Vin is fed before the capacitor voltage Csig_x discharges completely. Thus, the charging period of the second pulse of the capacitor voltage Csig_x becomes shorter by a time-period from a to b in the figure. Specifically, the period for the second pulse of the output voltage Vout to drop to Low becomes shorter by the time-period from a to b, compared to the case of FIG. 27(a) in which Toff>t3 and there is no overlap in the capacitor voltage Csig_x. As a result, there arises a problem that the period of the first pulse of the output voltage Vout becomes shorter than the pulse period of the input voltage Vin.

This problem is solved if the discharging period of the capacitor voltage Csig_x is set short. Specifically, the problem is solved if the discharging period with respect to the pulse of the input voltage Vin shown in FIG. 27(b) is set in such a way as to satisfy t3x<Toff<t3 (t3x indicates t3 of the case in which the discharging period is shortened) to avoid an overlap in the waveform of the capacitor voltage Csig_x. However, if the discharging period is shortened, the capability of preventing errors, such as chattering, shown in FIG. 26 is degraded. Accordingly, there is a problem that the capability of outputting a pulse having a same period as that of an input pulse having a short pause period and the capability of preventing errors are in trade-off relationship.

SUMMARY OF THE INVENTION

The present invention has as an object to provide a comparing circuit and an infrared receiver that are capable of preventing errors, and at the same time, are improved in capability of outputting a pulse having a same period as that of an input pulse having a short pause period.

To attain this object, the comparing circuit of the present invention includes: a charging and discharging circuit to charge a capacitor with charging current and discharge the capacitor with discharging current by switching alternately between a charging operation and a discharging operation in response to a switch in level of an input pulse signal between a High-level and a Low-level; a first comparator circuit to compare a capacitor-voltage of the capacitor with a predetermined threshold voltage; an output-signal generating circuit to generate and output an output pulse-signal based on a first pulse-signal supplied from the first comparator circuit; and current-value adjusting means for adjusting a value of the charging current and a value of the discharging current of the charging and discharging circuit by generating a signal that is based on the first pulse-signal and is to adjust the value of the charging current and the value of the discharging current, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the first comparator circuit supplying, when the capacitor-voltage becomes higher than the second threshold voltage in charging the capacitor, the output-signal generating circuit with the first pulse-signal to switch a level of the output pulse-signal between a High-level and a Low-level, and the first comparator circuit supplying, when the capacitor-voltage becomes lower than the first threshold voltage in discharging the capacitor, the output-signal generating circuit with the first pulse-signal to switch the level of the output pulse-signal between the High-level and the Low-level.

With this configuration, the first comparator circuit compares the capacitor-voltage with the first threshold voltage and the capacitor-voltage with the second threshold voltage, which is higher than the first threshold voltage. Then, the first comparator circuit generates a first pulse-signal responsive to one of the following cases: the capacitor-voltage is lower than the first threshold voltage; the capacitor-voltage is between the first threshold voltage and the second threshold voltage, inclusive; and the capacitor-voltage is higher than the second threshold voltage.

When the capacitor-voltage increases and becomes higher than the second threshold voltage in charging the capacitor, the output-signal generating circuit is supplied with the first pulse-signal to switch the level of the output pulse-signal between the High-level and the Low-level. As a result, the level of the output pulse-signal switches between the High-level and the Low-level.

When the capacitor-voltage decreases and becomes lower than the first threshold voltage in discharging the capacitor, the output-signal generating circuit is supplied with the first pulse-signal to switch the level of the output pulse-signal between the High-level and the Low-level. As a result, the level of the output pulse-signal switches between the High-level and the Low-level.

Accordingly, charging and discharging the capacitor are switched alternately to switch the level of the output pulse-signal between the High-level and the Low-level. In other words, the first pulse-signal supplied from the first comparator circuit determines a pulse period of the output pulse-signal.

Further, on the basis of the first pulse-signal generated by the first comparator circuit, the current-value adjusting means generates a signal to adjust the value of the charging current and the value of the discharging current of the charging and discharging circuit. The current-value adjusting means supplies the charging and discharging circuit with this signal to adjust the value of the charging current and the value of the discharging current, thereby adjusting a charging period and a discharging period.

With the charging period and the discharging period both being adjusted, the first comparator circuit performs a comparison operation on the respective voltages in the same manner as described above and then supplies the output-signal generating circuit with the first pulse-signal. Accordingly, the output-signal generating circuit generates and outputs an output pulse-signal that is switched between the High-level and the Low-level on the basis of the first pulse-signal responsive to a state in which the charging period and the discharging period are adjusted.

Thus, if the discharging period is shortened, the level of the output pulse-signal switches quickly between the High-level and the Low-level. Thus, even if a pause period between an input pulse signal and a following pulse is shortened by that shortened period of the discharging period, a period of an output pulse is not affected. Therefore, no deviation occurs in the period of the input pulse and the period of the output pulse. Thus, it becomes possible to output the following pulse, which is supplied immediately after the input pulse, with a period that is same as that of the input pulse.

Accordingly, capability of outputting the pulse having the same period as that of the input pulse having a short pause period improves.

Further, when the first comparator circuit outputs the first pulse-signal responsive to the case in which the capacitor-voltage is between the first threshold voltage and the second threshold voltage, inclusive, the value of the charging current and the value of the discharging current are adjusted to be reduced in the charging and discharging circuit, thereby setting the charging period and the discharging period long. Thus, even if the input pulse is split, the capacitor-voltage does not become lower than the first threshold voltage.

Because the capacitor-voltage does not become lower than the first threshold voltage even if the input pulse is split, the first comparator circuit does not supply the output-signal generating circuit with the first pulse-signal to switch the level of the output pulse-signal between the High-level and the Low-level. Thus, the output pulse is not affected by that split-pulse and is output normally. Accordingly, even if an error occurs in the input pulse, the output pulse is prevented from an error.

With the foregoing configuration, the comparing circuit of the present invention maintains capability of preventing errors, and at the same time, improves in capability of outputting a pulse having a same period as that of an input pulse having a short pause period.

Further, the comparing circuit of the present invention includes: a charging and discharging circuit to charge a capacitor with charging current and discharge the capacitor with discharging current by switching alternately between a charging operation and a discharging operation in response to a switch in level of an input pulse signal between a High-level and a Low-level; a first comparator circuit and a second comparator circuit, each of which is to compare a capacitor-voltage of the capacitor with a predetermined threshold voltage; an output-signal generating circuit to generate and output an output pulse-signal based on a second pulse-signal supplied from the second comparator circuit; and current-value adjusting means for adjusting a value of the charging current and a value of the discharging current of the charging and discharging circuit by generating a signal that is based on a first pulse-signal and is to adjust the value of the charging current and the value of the discharging current, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the second comparator circuit comparing the capacitor-voltage with a third threshold voltage, which is higher than the first threshold voltage and lower than the second threshold voltage, to generate the second pulse-signal responsive to either of (a) a case in which the capacitor-voltage is lower than the third threshold voltage and (b) a case in which the capacitor-voltage is higher than the third threshold voltage, the second comparator circuit supplying, when the capacitor-voltage becomes higher than the third threshold voltage in charging the capacitor, the output-signal generating circuit with the second pulse-signal to switch a level of the output pulse-signal between a High-level and a Low-level, and the second comparator circuit supplying, when the capacitor-voltage becomes lower than the third threshold voltage in discharging the capacitor, the output-signal generating circuit with the second pulse-signal to switch the level of the output pulse-signal between the High-level and the Low-level.

With this configuration, the first comparator circuit compares the capacitor-voltage with the first threshold voltage and the capacitor-voltage with the second threshold voltage, which is higher than the first threshold voltage. Then, the first comparator circuit generates a first pulse-signal responsive to one of the following cases: the capacitor-voltage is lower than the first threshold voltage; the capacitor-voltage is between the first threshold voltage and the second threshold voltage, inclusive; and the capacitor-voltage is higher than the second threshold voltage.

Further, the second comparator circuit compares the capacitor-voltage with the third threshold voltage, which is higher than the first threshold voltage and lower than the second threshold voltage and has a hysteresis characteristic. Then, the second comparator circuit generates a second pulse-signal responsive to either of the following cases: the capacitor-voltage is lower than the third threshold voltage; and the capacitor-voltage is higher than the third threshold voltage.

When the capacitor-voltage increases and becomes higher than the third threshold voltage in charging the capacitor, the output-signal generating circuit is supplied with the second pulse-signal to switch the level of the output pulse-signal between the High-level and the Low-level. As a result, the level of the output pulse-signal switches between the High-level and the Low-level.

When the capacitor-voltage decreases and becomes lower than the third threshold voltage in discharging the capacitor, the output-signal generating circuit is supplied with the second pulse-signal to switch the level of the output pulse-signal between the High-level and the Low-level. As a result, the level of the output pulse-signal switches between the High-level and the Low-level.

Accordingly, charging and discharging the capacitor are switched alternately to switch the level of the output pulse-signal between the High-level and the Low-level. In other words, the second pulse-signal supplied from the second comparator determines a pulse period of the output pulse-signal.

Further, on the basis of the first pulse-signal generated by the first comparator circuit, the current-value adjusting means generates a signal to adjust the value of the charging current and the value of the discharging current of the charging and discharging circuit. The current-value adjusting means supplies the charging and discharging circuit with this signal to adjust the value of the charging current and the value of the discharging current, thereby adjusting a charging period and a discharging period.

With the charging period and the discharging period both being adjusted, the second comparator circuit performs a comparison operation on the respective voltages in the same manner as described above and then supplies the output-signal generating circuit with the second pulse-signal. Accordingly, the output-signal generating circuit generates and outputs an output pulse-signal that is switched between the High-level and the Low-level on the basis of the second pulse-signal responsive to a state in which the charging period and the discharging period are adjusted.

Thus, if the discharging period is shortened, the level of the output pulse-signal switches quickly between the High-level and the Low-level. Thus, even if a pause period between an input pulse signal and a following pulse is shortened by that shortened period of the discharging period, a period of an output pulse is not affected. Therefore, no deviation occurs in the period of the input pulse and the period of the output pulse. Thus, it becomes possible to output the following pulse, which is supplied immediately after the input pulse, with a period that is same as that of the input pulse.

Accordingly, capability of outputting a pulse having a same period as that of an input pulse having a short pause period improves.

Further, the third threshold voltage is given, and the second comparator circuit supplies the output-signal generating circuit with the second pulse-signal when the capacitor-voltage becomes higher than the third threshold voltage in charging. The time when the capacitor-voltage becomes higher than the third threshold voltage is faster than, for example, the time when the capacitor-voltage becomes higher than the second threshold voltage and the output-signal generating circuit is supplied with the signal to switch the level of the output pulse-signal between the High-level and the Low-level. Thus, the level of the output pulse-signal is switched between the High-level and the Low-level more quickly.

Therefore, even if a pulse having a short pulse-width is supplied, the second comparator circuit responds to the case and outputs the second pulse-signal normally. On the basis of this second pulse-signal, the level of the output pulse-signal is switched between the High-level and the Low-level. Therefore, responsiveness to an input pulse having a short pulse-width improves. In other words, responsiveness to an input pulse having a short period also improves.

Further, when the first comparator circuit outputs the first pulse-signal responsive to the case in which the capacitor-voltage is between the first threshold voltage and the second threshold voltage, inclusive, the value of the charging current and the value of the discharging current of the charging and discharging circuit are adjusted to be reduced, thereby setting the charging period and the discharging period long. Thus, even if the input pulse is split, the capacitor-voltage does not become lower than the third threshold voltage.

Because the capacitor-voltage does not become lower than the third threshold voltage even if the input pulse is split, the second comparator circuit does not supply the output-signal generating circuit with the second pulse-signal to switch the level of the output pulse-signal between the High-level and the Low-level. Thus, the output pulse is not affected by that split-pulse and is output normally. Accordingly, even if an error occurs in the input pulse, the output pulse is prevented from an error.

With the foregoing configuration, the comparing circuit of the present invention maintains capability of preventing errors, and at the same time, improves in capability of outputting a pulse having a same period as that of an input pulse having a short pause period. Furthermore, the comparing circuit of the present invention also improves in responsiveness to an input pulse having a short period and a short pulse-width.

Further, the comparing circuit of the present invention includes: a charging and discharging circuit to charge a capacitor with charging current and discharge the capacitor with discharging current by switching alternately between a charging operation and a discharging operation in response to a switch in level of an input pulse signal between a High-level and a Low-level; a first comparator circuit to compare a capacitor-voltage of the capacitor with a predetermined threshold voltage, and a plurality of third comparator circuits, each of which is to compare the capacitor-voltage of the capacitor with a predetermined threshold voltage; a plurality of output-signal generating circuits, each of which is to individually generate and output an output pulse-signal based on a third pulse-signal supplied individually from the plurality of third comparator circuits; and current-value adjusting means for adjusting a value of the charging current and a value of the discharging current of the charging and discharging current by generating a signal that is based on a first pulse-signal and is to adjust the value of the charging current and the value of the discharging current of the charging and discharging circuit, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the plurality of third comparator circuits, for each of which a threshold voltage higher than the first threshold voltage and lower than the second threshold voltage is set individually, comparing the capacitor-voltage with the threshold voltage to generate the third pulse-signal responsive to either of (a) a case in which the capacitor-voltage is lower than the threshold voltage and (b) a case in which the capacitor-voltage is higher than the threshold voltage, the plurality of third comparator circuits individually supplying, when the capacitor-voltage becomes higher than the threshold voltage in charging the capacitor, the output-signal generating circuit with the third pulse-signal to switch a level of the output pulse-signal between a High-level and a Low-level, and the plurality of third comparator circuits individually supplying, when the capacitor-voltage becomes lower than the threshold voltage in discharging the capacitor, the output-signal generating circuit with the third pulse-signal to switch the level of the output pulse-signal between the High-level and the Low-level.

With this configuration, the first comparator circuit compares the capacitor-voltage with the first threshold voltage and the capacitor-voltage with the second threshold voltage, which is higher than the first threshold voltage. Then, the first comparator circuit generates a first pulse-signal responsive to one of the following cases: the capacitor-voltage is lower than the first threshold voltage; the capacitor-voltage is between the first threshold voltage and the second threshold voltage, inclusive; and the capacitor-voltage is higher than the second threshold voltage.

Each of the third comparator circuit compares the capacitor-voltage with the threshold voltage, which is higher than the first threshold voltage and lower than the second threshold voltage and is set individually. Then, the third comparator circuit generates a third pulse-signal responsive to either of the following cases: the capacitor-voltage is lower than the threshold voltage; and the capacitor-voltage is higher than the threshold voltage.

When the capacitor-voltage increases and becomes higher than the threshold voltage in charging the capacitor, the output-signal generating circuit is supplied with the third pulse-signal to switch a level of the output pulse-signal between a High-level and a Low-level. As a result, the level of the output pulse-signal switches between the High-level and the Low-level.

When the capacitor-voltage decreases and becomes lower than the threshold voltage in discharging the capacitor, the output-signal generating circuit is supplied with the third pulse-signal to switch the level of the output pulse-signal between the High-level and the Low-level. As a result, the level of the output pulse-signal switches between the High-level and the Low-level.

Accordingly, charging and discharging the capacitor are switched alternately to switch the level of the output pulse-signal between the High-level and the Low-level. In other words, the third pulse-signal supplied from the third comparator determines a pulse period of the output pulse-signal.

Further, on the basis of the first pulse-signal generated by the first comparator circuit, the current-value adjusting means generates a signal to adjust the value of the charging current and the value of the discharging current of the charging and discharging circuit. The current-value adjusting means supplies the charging and discharging circuit with this signal to adjust the value of the charging current and the value of the discharging current, thereby adjusting a charging period and a discharging period.

With the charging period and the discharging period both being adjusted, the third comparator circuit performs a comparison operation on the respective voltages in the same manner as described above and then supplies the output-signal generating circuit with the third pulse-signal. Accordingly, the output-signal generating circuit generates and outputs an output pulse-signal that is switched between the High-level and the Low-level on the basis of the third pulse-signal responsive to a state in which the charging period and the discharging period are adjusted.

Thus, if the discharging period is shortened, the level of the output pulse-signal switches quickly between the High-level and the Low-level. Thus, even if a pause period between an input pulse signal and a following pulse is shortened by that shortened period of the discharging period, a period of an output pulse is not affected. Therefore, no deviation occurs in the period of the input pulse and the period of the output pulse. Thus, it becomes possible to output that a following pulse, which is supplied immediately after the input pulse, with a period that is same as that of the input pulse.

Accordingly, capability of outputting a pulse having a same period as that of an input pulse having a short pause period improves.

Further, with the plurality of third comparator circuits being provided, a plurality of output pulses, each having a different pulse-width from each other, are supplied individually to the output-signal generating circuit on the basis of results of the comparisons with the threshold voltages that are set individually for the respective third comparator circuits. This makes it possible to change the output-pulse width responsive to the different threshold voltages, thereby generating output pulses each having a different pulse-width.

Further, when the first comparator circuit outputs the first pulse-signal responsive to the case in which the capacitor-voltage is between the first threshold voltage and the second threshold voltage, inclusive, the value of the charging current and the value of the discharging current of the charging and discharging circuit are adjusted to be reduced, thereby setting the charging period and the discharging period long. Thus, even if the input pulse is split, the capacitor-voltage does not become lower than the threshold voltage.

Because the capacitor-voltage does not become lower than the threshold voltage even if the input pulse is split, the third comparator circuit does not supply the output-signal generating circuit with the third pulse-signal to switch the level of the output pulse-signal between the High-level and the Low-level. Thus, the output pulse is not affected by that split-pulse and is output normally. Accordingly, even if an error occurs in the input pulse, the output pulse is prevented from an error.

The foregoing configuration allows the comparing circuit of the present invention to maintain capability of preventing errors, and at the same time, improve in capability of outputting a pulse having a same period as that of an input pulse having a short pause period. Furthermore, with the comparing circuit of the present invention, an output pulse with a desired pulse-width or a desired delay-time becomes obtainable.

Further, an infrared receiver of the present invention includes the comparing circuit discussed above.

With this configuration, the comparing circuit is provided so that capability of preventing errors is maintained, and at the same time, capability of outputting a pulse having a same period as that of an input pulse having a short pause period improves. Further, with the comparing circuit being provided, responsiveness to an input pulse having a short period and a short pulse-width improves.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 4 is a truth table of an SR latch circuit and an output circuit of the comparing circuit.

FIG. 5($b$) is a timing chart showing waveforms in operations of the comparing circuit at the time when pulses are supplied continuously and t2<Toff<t3.

FIG. 7 is a truth table for the SR latch circuit and the output circuit of the comparing circuit at the time when an error occurs.

FIG. 9($b$) is a timing chart showing waveforms in operations of the initializing circuit at the time when a power source is given.

FIG. 12(b) is a circuit diagram connected with five MOS devices of a same size.

FIG. 27(a) is a timing chart showing waveforms in operations of the conventional comparing circuit at the time when pulses are supplied continuously and Toff>t3.

FIG. 27(b) is a timing chart showing waveforms in operations of the conventional comparing circuit at the time when pulses are supplied continuously and Toff<t3.

DESCRIPTION OF THE EMBODIMENTS

First Embodiment

The following describes an embodiment of the present invention, with reference to FIGS. 1 to 10.

Figure 1:
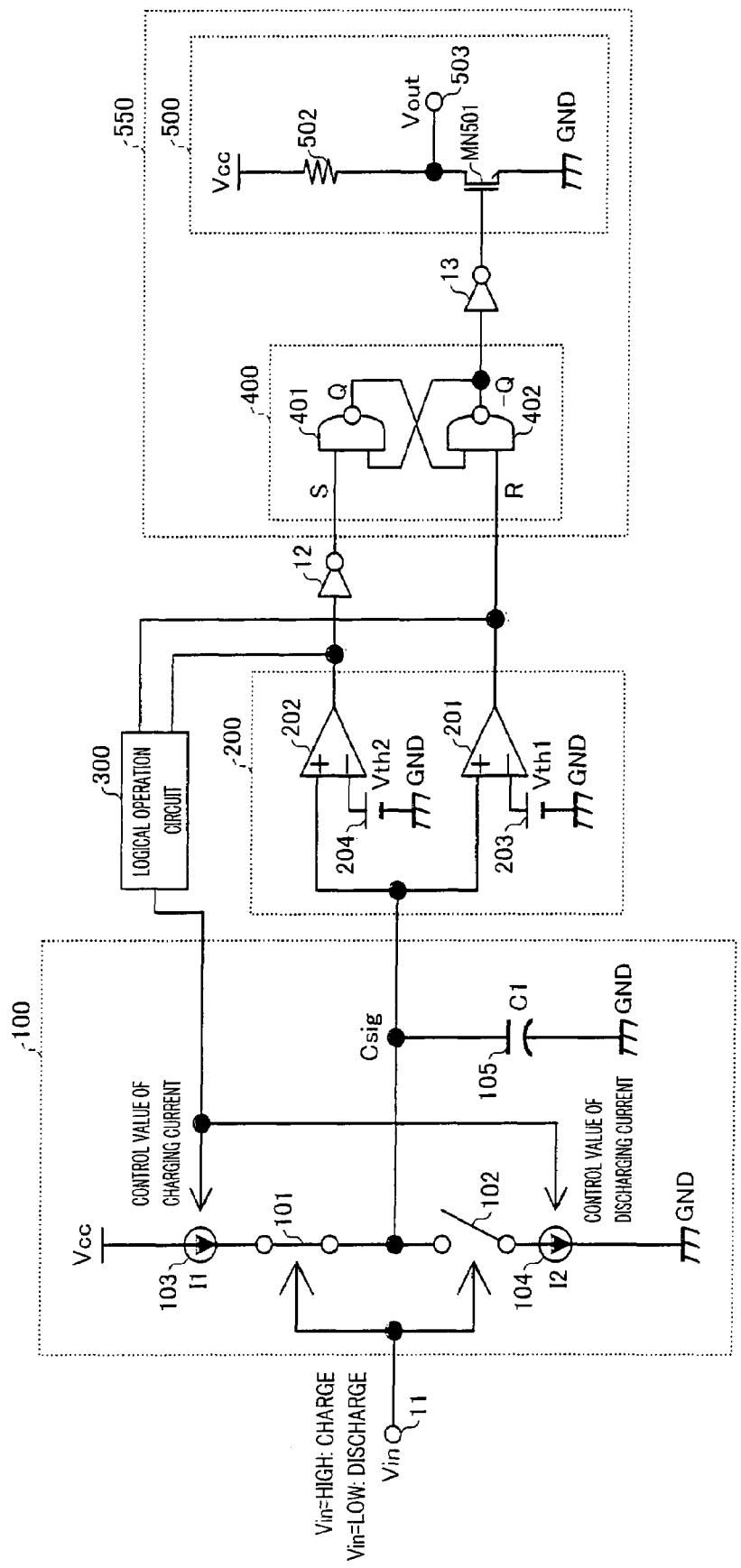
FIG. 1 is a circuit block diagram of a comparing circuit of an embodiment of the present invention.

FIG. 1 is a circuit block diagram showing an exemplary configuration of a comparing circuit 10.

In this figure, "MN" indicates an N-channel MOSFET, and "MP" indicates a P-channel MOSFET. When a voltage equal to or higher than a MOSFET threshold voltage (Vth) is applied across a gate and a source, conduction is made between a drain and the source, and current flows. Being ON means that conduction is made between the drain and the source. Being OFF means that no conduction is made between the drain and the source.

As shown in FIG. 1, the comparing circuit 10 of the present embodiment includes: a charging and discharging circuit 100; a comparator circuit 200 being a first comparator circuit; a logical operation circuit 300 being current-value adjusting means; an output-signal generating circuit 550 including an SR latch circuit 400 and an output circuit 500; an input section 11 into which an input pulse signal, i.e. an input voltage (Vin), is fed; a NOT gate 12 provided across the comparator circuit 200 and the SR latch circuit 400; and a NOT gate 13 provided across the SR latch circuit 400 and the output circuit 500.

The following describes basic operations, and configurations, of the charging and discharging circuit 100, with reference to FIG. 1.

The charging and discharging circuit 100 includes switching sections 101 and 102 being switching sections; a current source 103 being a first current-source; a current source 104 being a second current-source; and a capacitor 105. The charging and discharging circuit 100 charges and discharges the capacitor 105 in response to a switch made by the switching sections 101 and 102.

The switching section 101 is set in a manner such that it becomes ON when Vin=High and becomes OFF when Vin=Low. One of electrodes of the switching section 101 is connected to the current source 103. Another one of the electrodes of the switching section 101 is connected to the capacitor 105 and to the switching section 102.

The switching section 102 is set in a manner such that it becomes OFF when Vin=High and becomes ON when Vin=Low. One of electrodes of the switching section 102 is connected to the current source 104. Another one of the electrodes of the switching section 102 is connected to the capacitor 105 and to the switching section 101.

The current source 103 generates a constant-current I1. One end of the current source 103, from which end current flows out of the current source 103, is connected to the switching section 101. Another end of the current source 103 is connected to the power source. The current source 104 generates a constant-current I2. One end of the current source 104, from which end current flows out of the current source 104, is grounded. Another end of the current source 104 is connected to the switching section 102.

The capacitor 105 has a capacitance C1. One of electrodes of the capacitor 105 is connected to the switching section 101 and to the switching section 102. Another one of the electrodes of the capacitor 105 is grounded. A capacitor-voltage (Csig) of the capacitor 105 changes in charging and discharging. The following describes basic operations in charging and discharging the capacitor.

When an input voltage of Vin=High is fed into the input section 11, the switching section 101 becomes ON, and the switching section 102 becomes OFF. Thus, the constant-current I1 supplied from the current source 103 flows through the switching section 101 and then flows into the capacitor 105, whereby the capacitor 105 is charged.

On the other hand, when an input voltage of Vin=Low is fed into the input section 11, the switching section 101 becomes OFF, and the switching section 102 becomes ON. Thus, the current source 104 draws current from the capacitor 105 via the switching section 102 to let the constant-current I2 flow, whereby the capacitor 105 is discharged.

The current sources 103 and 104 are connected to the logical operation circuit 300. Values of output voltages of the current sources 103 and 104 are adjusted in response to output signals of the logical operation circuit 300. Specifically, as described below, the values of the constant-currents I1 and I2 are adjusted in response to results of comparisons performed by the comparator circuit.

The comparator circuit 200 includes: comparator circuit sections 201 and 202; a reference power-source 203 to generate a first threshold voltage (Vth1); and a reference power-source 204 to generate a second threshold voltage (Vth2). The comparator circuit section 201 of the comparator circuit 200 compares Csig of the charging and discharging circuit 100 with Vth1. If Csig is higher than the threshold voltage, then the comparator circuit section 201 generates a High-signal and supplies the High-signal to the logical operation circuit 300 and to the SR latch circuit 400 of the output-signal generating circuit 550. On the other hand, if Csig is lower than the threshold voltage, then the comparator circuit section 201 generates a Low-signal and supplies the Low-signal to the logical operation circuit 300 and to the SR latch circuit 400 of the output-signal generating circuit 550. Further, the comparator circuit section 202 of the comparator circuit 200 compares Csig with Vth2. If Csig is higher than the threshold voltage, then the comparator circuit section 202 generates a High-signal and supplies the High-signal to the logical operation circuit 300 and to the SR latch circuit 400 of the output-signal generating circuit 550. On the other hand, if Csig is lower than the threshold voltage, then the comparator circuit section 202 generates a Low-signal and supplies the Low-signal to the logical operation circuit 300 and to the SR latch circuit 400 of the output-signal generating circuit 550. In other words, each of the comparator circuit sections 201 and 202 generates a pulse signal (first pulse-signal) of High-level or Low-level and supplies the pulse signal to the logical operation circuit 300 and to the SR latch circuit 400 of the output-signal generating circuit 550.

Vth1 and Vth2 are set in such a way as to satisfy Equation (7) below.

$$\max\_Csig > Vth2 > Vth1 > \min\_Csig \quad \text{Equation (7)}$$

(where "max_Csig" is a maximum charging voltage of the capacitor 105, and "min_Csig" is a minimum charging voltage of the capacitor 105)

In response to an output signal supplied from the comparator circuit 200, the logical operation circuit 300 supplies the current source 103 of the charging and discharging circuit 100 with a signal to adjust the constant-current I1 of the current source 103, and supplies the current source 104 with a signal to adjust the constant-current I2 of the current source 104. Specifically, the logical operation circuit 300 receives a pulse signal generated on the basis of a result of comparison of Csig with Vth1 and a pulse signal generated on the basis of a result of comparison of Csig with Vth2. Then, the logical operation circuit 300 performs a logical operation on the pulse signals. Thereafter, the logical operation circuit 300 outputs signals to adjust the constant-current I1 and the constant-current I2. Accordingly, the constant-currents I1 and I2 are adjusted in response to the pulse signals generated on the basis of results of comparisons performed by the comparator circuit 2003.

The SR latch circuit 400 includes NAND gates 401 and 402. The SR latch circuit 400 retains data on output signals (pulse signals) supplied from the comparator circuit 200. Table 2 shows logic of the SR latch circuit 400. The present circuit uses the SR latch circuit 400 in such a manner that the data is held when S=R=1, and Q and −Q toggle (are reversed) when a pulse is supplied to S or to R. When a process to retain the data is finished, an output signal is supplied to the output circuit 500.

TABLE 2

| S (set) | R (reset) | Q | −Q | |
|---|---|---|---|---|
| 0 | 0 | 1 | 1 | ← not allowed |
| 0 | 1 | 0 | 1 | |
| 1 | 0 | 1 | 0 | |
| 1 | 1 | Q | −Q | ← hold |

The output circuit 500 includes an MN501, a resistor 502, and an output section 503. A gate of the MN501 is connected to the SR latch circuit 400 via the NOT gate 13. A drain of the MN501 is connected to the output section 503 and to the power source via the resistor 502. A source of the MN501 is grounded.

In response to an output signal supplied from the SR latch circuit 400, the output circuit 500 outputs an output pulse-signal, i.e. an output voltage (Vout), via the output section 503. Specifically, when a High-signal is fed, the MN501 becomes ON, so that the output voltage Vout becomes Low (=GND). On the other hand, when a Low-signal is fed, the MN501 becomes OFF, so that the output voltage Vout becomes High (=Vcc).

Figure 2:
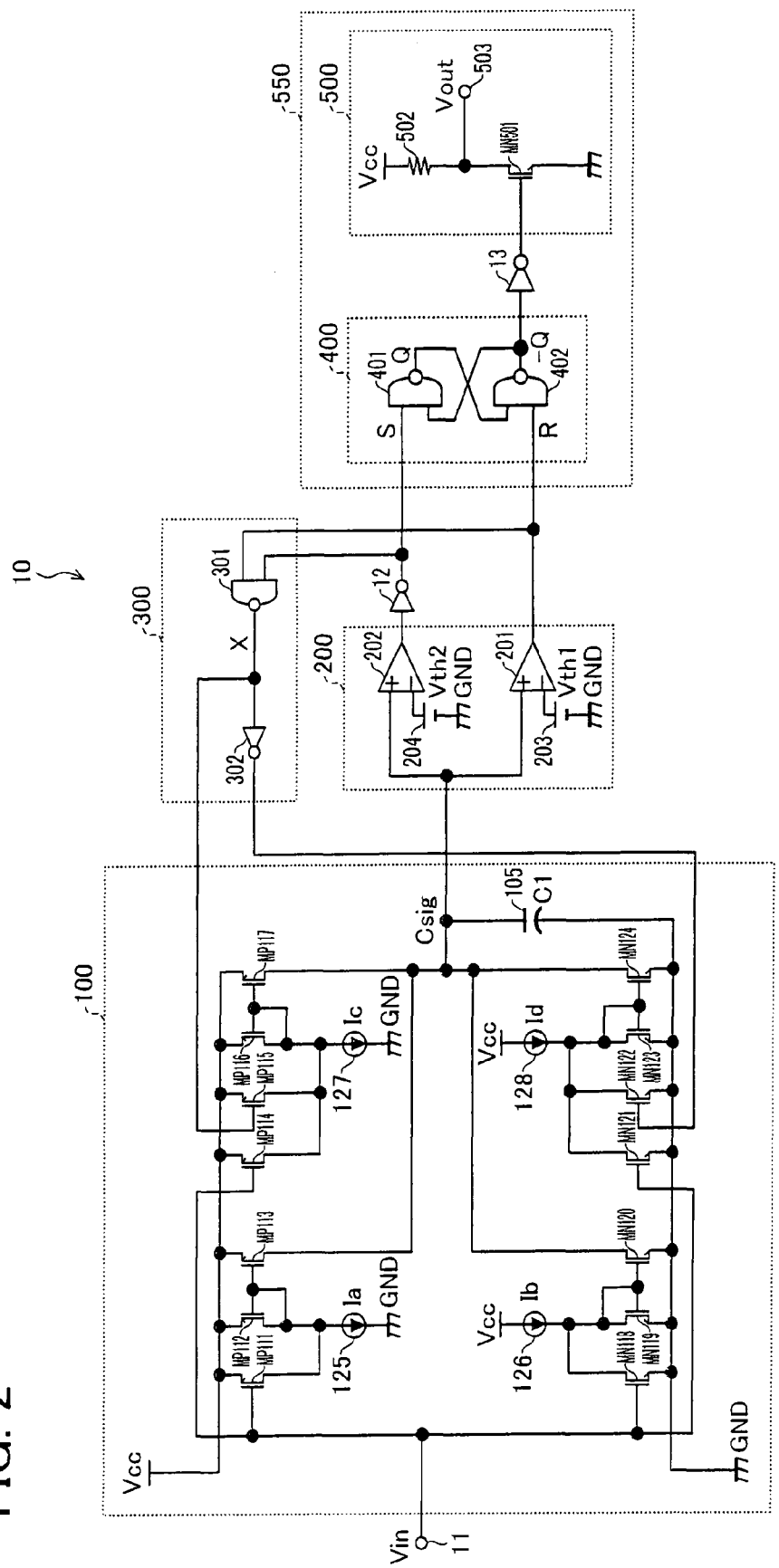
FIG. 2 is a circuit diagram showing an exemplary configuration of the comparing circuit.

The following describes exemplary and concrete configurations of the charging and discharging circuit 100 and the logical operation circuit 300, with reference to FIG. 2. FIG. 2 is a circuit diagram showing in detail an exemplary configuration of the comparing circuit 10.

The following describes operations, and configurations, of the charging and discharging circuit 100. In the description of the charging and discharging circuit 100 below, no signal is supplied from the logical operation circuit 300, that is, an MP115 and an MN122 are OFF. A case in which a signal is supplied from the logical operation circuit 300 will be described later.

The charging and discharging circuit 100 includes: MP111-MP117; MN118-MN124; a current source 125 to generate a current Ia; a current source 126 to generate a current Ib; a current source 127 to generate a current Ic; a current source 128 to generate a current Id; and a capacitor 105. The MP111-MP117 constitute the switching section 101. The MN118-MN124 constitute the switching section 102. The current sources 125 and 127 constitute the current source 103. The current sources 126 and 128 constitute the current source 104.

When the input voltage of Vin=High is fed into the input section 11, the MP111 and the MP114 become OFF, and the MN118 and the MN121 become ON. When the MN118 and the MN121 become ON, the current Ib supplied from the current source 126 flows through a path from the Vcc to the GND via the MN118, and the current Id supplied from the current source 128 flows a path from the Vcc to the GND via the MN121. Thus, no current flows through the MN119, the MN120, and the MN122-MN124.

When the MP111 and MP114 become OFF, the current source 125 lets the current Ia flow through the MP112 and the MP113. The current Ia flows through a path from the Vcc to the GND via the MP112. The MP112 and the MP113 form a current mirror. Thus, the current Ia flows through the MP113 and then flows into the capacitor 105, whereby the capacitor 105 is charged.

The current source 127 lets the current Ic flow through the MP116 and the MP117. The current Ic flows through a path from the Vcc to the GND via the MP116. The MP116 and the MP117 form a current mirror. Thus, the current Ic flows through the P117 and then flows into the capacitor 105, whereby the capacitor 105 is charged. Accordingly, the capacitor 105 is charged by a current that is the sum of the current Ia and the current Ic.

On the other hand, when the input voltage of Vin=Low is fed into the input section 11, the MP111 and the MP114 become ON, and the MN118 and the MN121 become OFF. When the MP111 and the MP114 become ON, the current Ia supplied from the current source 125 flows through a path from the Vcc to the GND via the MP111, and the current Ic supplied from the current source 127 flows through a path from the Vcc to the GND via the MP114. Thus, no current flows through the MP112, the MP113, and the MP115-117.

When the MN118 and the MN121 become OFF, the current source 126 lets the current Ib flow through the MN119 and the MN120. The current Ib flows through a path from the Vcc to the GND via the MN119. The MN119 and the MN120 form a current mirror. Thus, in order to let the current Ib flows through the MN120, the current Ib is drawn from the capacitor 105, whereby the capacitor 105 is discharged.

The current source 128 lets the current Id flows through the MN123 and the MN124. The current Id flows through a path from the Vcc to the GND via the MN123. The MN123 and the MN124 form a current mirror. Thus, in order to let the current Id flow through the MN124, the current Id is drawn from the capacitor 105, whereby the capacitor 105 is discharged. Accordingly, the capacitor 105 is discharged by a current that is the sum of the current Ib and the current Id.

The logical operation circuit 300 includes a NAND gate 301 and a NOT gate 302. The NAND gate 301 receives two output signals from the comparator circuit 200, and performs a logical operation on the output signals. An output signal (X) generated as a result of the logical operation is fed into the charging and discharging circuit 100, more specifically, into a gate of the MP115. The output signal (X) is also fed into the NOT gate 302. The NOT gate 302 performs a logical operation on the output signal supplied from the NAND gate 301. An output signal generated as a result of the logical operation is fed into the charging and discharging circuit 100, more specifically, into a gate of the MN122.

When the output signal of the NAND gate 301 is X=High, the MP115 becomes OFF. On the other hand, when X=Low, the MP115 becomes ON. When the MP115 is ON, the current Ic flows through a path from the Vcc to the GND via the MN115. Thus, no current flows through the MP116 and the MP117. Therefore, a current to flow through the MP117, that is, the current Ic does not charge the capacitor 105.

Further, when the output signal of the NAND gate 301 is X=High, the output signal of the NOT gate 302 becomes Low, so that the MN122 becomes OFF. On the other hand, when the output signal of the NAND gate 301 is X=Low, the output signal of the NOT gate 302 becomes High, so that the MN122 becomes ON. When the MN122 is ON, the current Id flows through a path from the Vcc to the GND via the MN122. Thus, no current flows through the MN123 and the MN124. Therefore, a current to flow through the MN124, that is, the current Id does not discharge the capacitor 105.

Accordingly, when the output signal of the NAND gate 301 is X=Low, neither charging by the current Ic nor discharging by the current Id is carried out.

Figure 3:
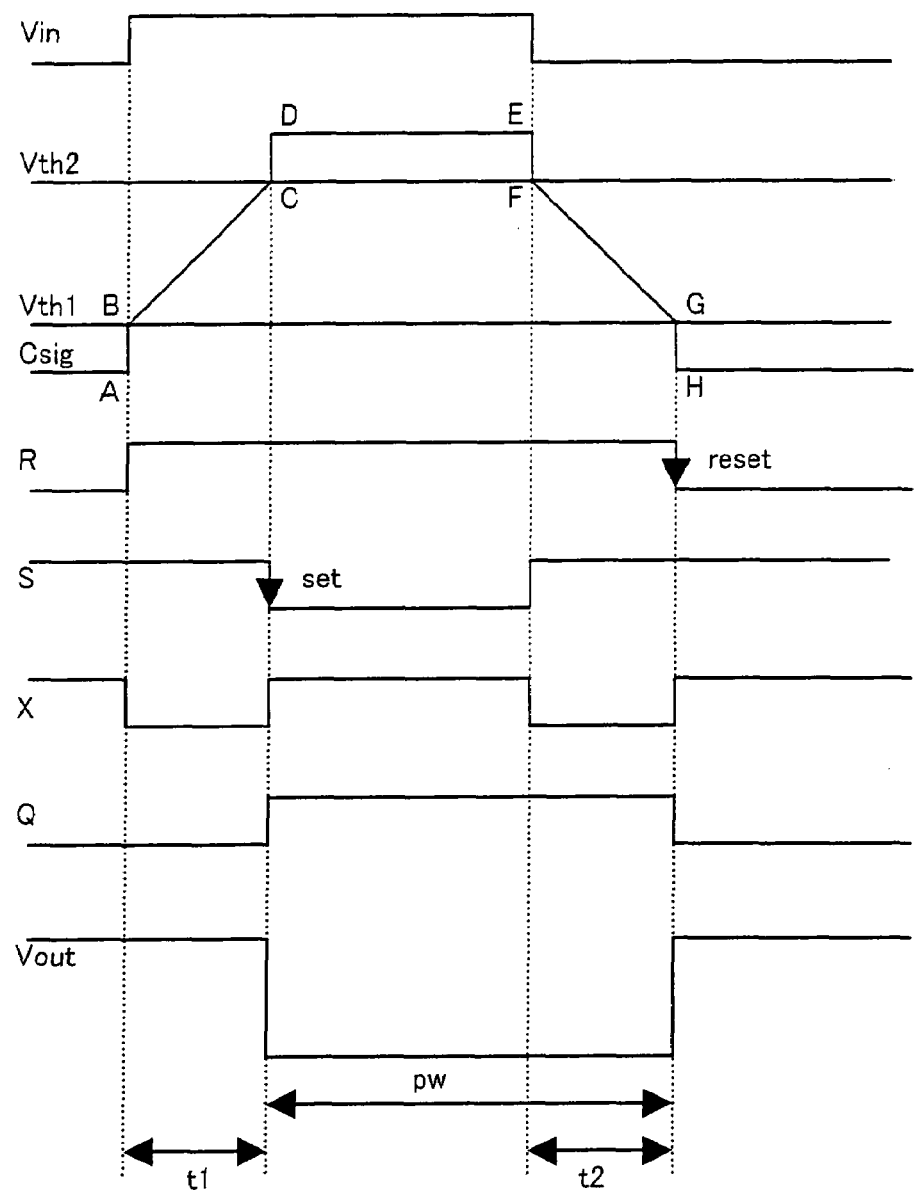
FIG. 3 is a timing chart showing waveforms in operations of the comparing circuit.

The following describes operations performed in the comparing circuit 10 of the present embodiment, with reference to FIG. 3.

FIG. 3 shows waveforms in operations of the comparing circuit 10. In the waveforms discussed below, "Vin" indicates an input voltage, "Vth1" indicates a first threshold voltage, "Vth2" indicates a second threshold voltage, "Csig" indicates a capacitor voltage of the capacitor 105, "R" indicates a resetting input signal of the SR latch circuit 400, "S" indicates a setting input signal of the SR latch circuit 400, "X" indicates an output signal of the NAND gate 301, "Q" indicates a positive logical value of the SR latch circuit 400, "Vout" indicates an output voltage, "t1" indicates a delay time in a response of the output pulse to a rise of the input pulse, "t2" indicates a delay time in a response of the output pulse to a drop of the input pulse, and "pw" indicates a pulse width.

As described above, in the comparing circuit 10 of the present embodiment, the capacitor 105 is charged when Vin=High, and discharged when Vin=Low.

As shown in FIG. 3, when the input voltage of Vin=Low rises to Vin=High, the capacitor voltage Csig rises rapidly to the threshold voltage Vth1 (from point A to point B). Thereafter, the capacitor voltage Csig rises to the threshold voltage Vth2 (from point B to point C) in accordance with a time constant. When reaching the threshold voltage Vth2, the capacitor voltage Csig rises rapidly to a max_Csig of the capacitor 105 (from point C to point D). Thereafter, the capacitor voltage Csig stays at the max_Csig (from point D to point E).

Then, when the input voltage of Vin=High drops to Vin=Low, the capacitor voltage Csig drops rapidly to the threshold voltage Vth2 (from point E to point F). Thereafter, the capacitor voltage Csig drops to the Vth1 (from point F to point G) in accordance with a time constant. When reaching the threshold voltage Vth1, the capacitor voltage Csig drops rapidly until the capacitor 105 is discharged completely (from point G to point H). Thereafter, the capacitor voltage Csig stays at the GND (Low).

In other words, when the input voltage of Vin=Low rises to Vin=High, the capacitor 105 is charged rapidly (from point A to point B). Thereafter, the capacitor 105 is charged in accordance with the time constant (from point B to point C). When the capacitor voltage Csig reaches the threshold voltage Vth2, the capacitor 105 is charged rapidly until the capacitor voltage Csig reaches the max_Csig of the capacitor 105 (from point C to point D). Consequently, the capacitor 105 is fully charged to saturation (from point D to point E).

Then, when the input voltage of Vin=High drops to Vin=Low, the capacitor 105 is discharged rapidly (from point E to point F). Thereafter, the capacitor 105 is discharged in accordance with the time constant (from point F to point G). When the capacitor voltage Csig reaches the threshold voltage Vth1, the capacitor 105 is discharged rapidly until it is discharged completely (from point G to point H). Consequently, the capacitor 105 is discharged completely.

Note that, as described above, the capacitor 105 is charged by the currents Ia and Ic, and discharged by the currents Ib and Ic. However, when the output signal of the logical operation circuit 300, i.e. the output signal of the NAND gate 301, is X=Low, the MP115 and the MN122 become ON. Therefore, the capacitor 105 is neither charged by the current Ic nor discharged by the current Id.

FIG. 3 shows that the waveform of the output signal X of the NAND gate 301 is Low from point B to point C and from point F to point G. In other words, the MP115 and the MN122 of the charging and discharging circuit 100 are ON during the period from point B to point C and during the period from point F to point G. During the periods, the currents Ic and Id do not contribute to charging current and discharging current. Thus, the charging current and the discharging current become low. Thus, the charging period and the discharging period become long during the period from point B to point C and during the period from point F to point G.

The following describes charging operations and discharging operations, using the constants shown in FIG. 2.

From Point A to Point B, and from Point C to Point D:
  charging at a time constant $t/V = C1/(Ia+Ic)$
From Point B to Point C:
  Charging at a time constant $t/V = C1/Ia$
From Point E to Point F, and from Point G to Point H:
  discharging at a time constant $t/V = C1/(Ib+Id)$
From Point F to Point G:
  discharging at a time constant $t/V = C1/Ib$ In the case of the waveforms shown in FIG. 3, Ia<<Ic, and Ib<<Id.

The following describes waveforms in operations of the SR latch circuit 400 and waveforms in operations of the output circuit 500, with reference to FIGS. 3 and 4. FIG. 4 is a truth table of the SR latch circuit 400 and the output circuit 500. The High-level is indicated as "1", and the Low-level is indicated as "0".

At an initial state in which no input pulse has been fed (Vin=Low), (S, R)=(1, 0) and Q=0.

At point B, Csig>Vth1. Thus, R changes from 0 to 1, and (S, R)=(1, 1). Q stays at the same value.

At point C, Csig>Vth2. Thus, S changes from 1 to 0, and (S, R)=(0, 1). At this time, Q reverses from 0 to 1, and Vout changes from High to Low.

At point F, Csig<Vth2, and S changes from 0 to 1. Q stays at 1.

At point G, Csig<Vth1. Thus, R changes from 1 to 0, and (S, R)=(1, 0). At this time, Q reverses from 1 to 0, and Vout changes from Low to High.

Figure 5:
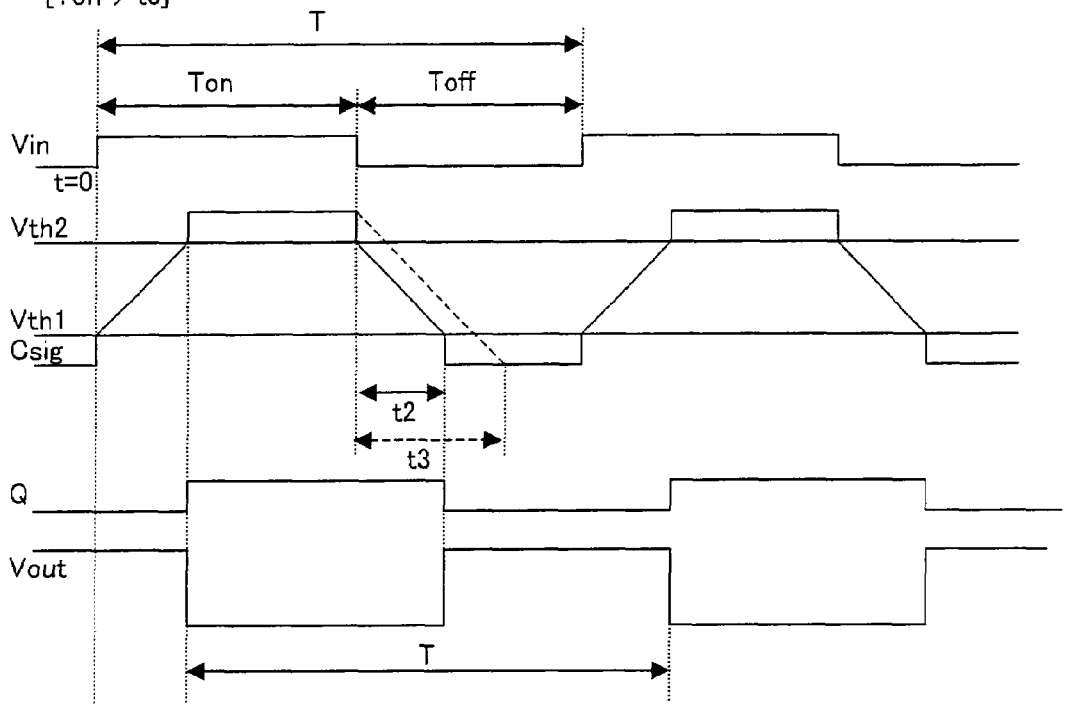
FIG. 5($a$) is a timing chart showing waveforms in operations of the comparing circuit at the time when pulses are supplied continuously and Toff>t3.
Figure 5:
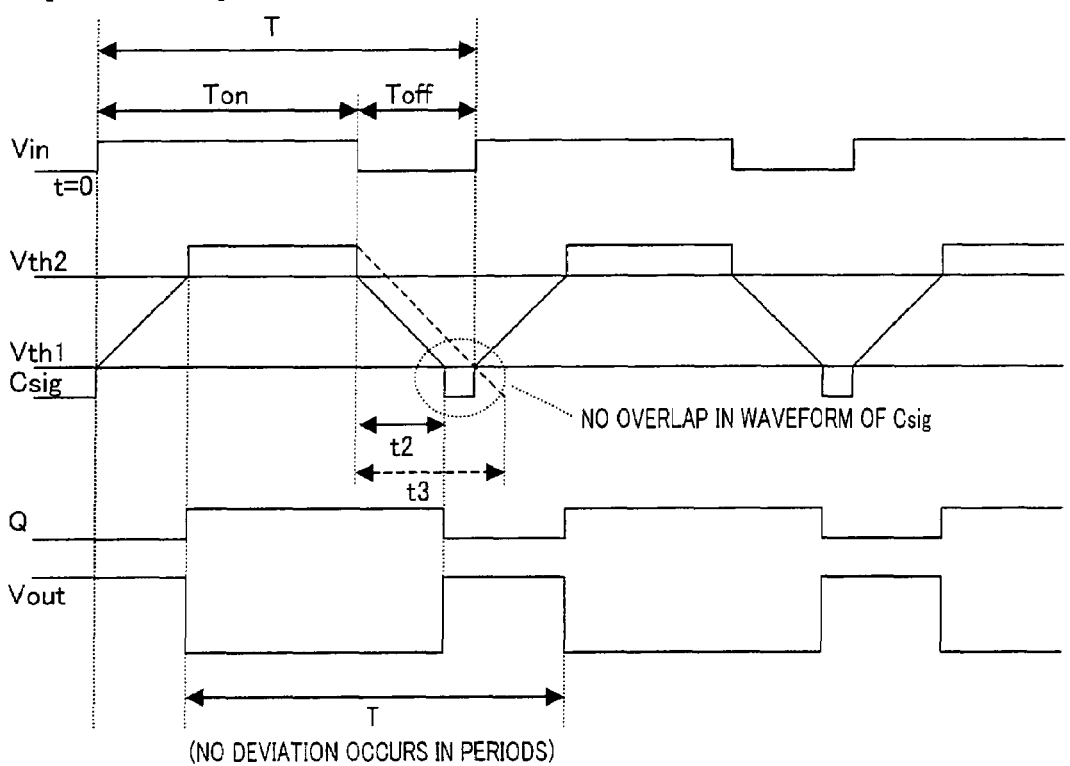

With reference to FIGS. 5(*a*) and 5(*b*), the following describes waveforms in operations of the comparing circuit 10 at the time when an input voltage Vin with a pulse having a time period T is fed continuously into the input section 11, starting from time t=0.

FIG. 5(*a*) shows the waveforms at the time when pulses are fed continuously and Toff>t3. FIG. 5(*b*) shows the waveforms at the time when pulses are fed continuously and t2<Toff<t3.

"Ton" indicates the period in which Vin=High. "Toff" indicates the period in which Vin=Low (pause period). One period (T) is the sum of the Ton and the Toff. A period from the time when the capacitor-voltage is fully charged to saturation to the time when the capacitor-voltage is discharged completely in a conventional comparing circuit (the circuit will be referred to as a conventional circuit hereinafter) is indicated as t3. Dashed lines indicate waveforms in operations of the conventional circuit.

As shown in FIG. 5(*a*), when Toff>t3, there is no overlap in the waveform of the capacitor voltage Csig of the comparing circuit 10 and in the waveform of the capacitor voltage Csig of the conventional circuit, and the output voltage Vout is output normally.

As shown in FIG. 5(*b*), when t2<Toff<t3, there is an overlap in the waveform of the capacitor voltage Csig of the conventional circuit. On the other hand, there is no overlap in the waveform of the capacitor voltage Csig of the comparing circuit 10, and the output voltage Vout is output normally.

Note that, as shown in FIG. 3, t2 indicates the delay time in a response of the output pulse to a drop of the input pulse, and at the same time, indicates a period from the time when the input voltage Vin reverses from High to Low to the time when the capacitor voltage Csig drops to the Low-level as a result of discharging. In the case of the waveforms shown in FIGS. 5(*a*) and 5(*b*), t2 is expressed by Equation (8) below, and t3 is expressed by Equation (9) below.

$$t2 = (Vcc - Vth2) \times C1/(Ib + Id) + (Vth2 - Vth1) \times C1/Ib + (Vth1 - 0) \times C1/(Ib + Id)$$

$$\approx (Vth2 - Vth1) \times C1/Ib$$

Equation (8)

$$t3 = Vcc \times C1/Ib$$

Equation (9)

For the purpose of comparison, the discharging current in the conventional comparing circuit is indicated as Ib. When Ib<<Id, the first and third terms of t2 in Equation (8) can be ignored.

Accordingly, the difference Δt between t2 and t3 is $$\Delta t = t3 - t2$$

$$= (Vcc - Vth2 + Vth1) \times C1/Ib$$

$$= (Vcc - \Delta Vth) \times C1/Ib.$$

Equation (10)

Thus, t2<t3. At this time, $$\Delta Vth = Vth2 - Vth1$$

Equation (11).

Note that ΔVth corresponds to a hysteresis voltage range (Vhis) of the conventional circuit.

Accordingly, the comparing circuit 10 of the present embodiment improves in capability of outputting a pulse having a shorter Toff than that in the case of the conventional circuit. In other words, the comparing circuit 10 improves in capability of outputting a pulse having the same period as that of an input pulse having a short pause period. Thus, it is possible to output a pulse having the same period as that of an input pulse having a pause period that is shortened by Δt of Equation (10).

The capacitor 105 is charged when Vin=High and discharged when Vin=Low in the comparing circuit 10 of the present embodiment. The threshold voltages Vth1 and Vth2 are set, and the capacitor voltage Csig in charging and discharging is divided into the following three periods (a) Csig<Vth1, (b) Vth1<Csig<Vth2, and (c) Csig<Vth2. The value of the charging current to flow into the capacitor 105 and the value of the discharging current to flow into the capacitor 105 are changed by the comparing circuit 10 so as to be responsive to the respective periods.

In FIG. 3, period (a) is the period from point A to point B and the period from point G to point H, period (b) is the period from point B to point C and the period from point F to point G, and period (c) is the period from point C to point F via points D and E.

During the period from point B to point C and the period from point F to point G, the currents Ic and Id do not contribute to the charging current and the discharging current. Therefore, if the currents are set to satisfy Ia<<Ic and Ib<<Id, the charging period and the discharging period other than the period from point B to point C and the period from point F to point G are shortened rapidly.

This makes it possible to shorten rapidly the period from point E to point F and the period from point G to point H, among the periods of the delay time t2 constituted of the period from point E to point F, the period from point F to point G, and the period from point G to point H. This allows the delay time t2 to be shortened. Accordingly, it becomes possible to output accurately a pulse having a same period as that of an input pulse having a short pause period. Note that, although the foregoing describes the waveforms in operations of the comparing circuit 10 in the case starting with charging and then switching to discharging, it is also possible to start with discharging and then switch to charging.

FIG. 3 shows waveforms of a case in which the charging period and the discharging period are set short in periods (a) and (c) and relatively long in period (b).

Specifically, the figure shows waveforms in the following case. The capacitor voltage Csig in period (a), the capacitor voltage Csig in period (b), and the capacitor voltage Csig in period (c) are voltages at one same point. However, the value of the charging current and the value of the discharging current (i.e. a time constant for charging, a time constant for discharging) differ, as determined by their relative relationship with the respective threshold voltages. The value of the charging current and the value of the discharging current of the respective capacitor voltages Csig(a) and Csig(c) in periods (a) and (c) are high (time constant is low). The value of the charging current and the value of the discharging current of the capacitor voltage Csig(b) in period (b) is low (time constant is high). The capacitor voltages Csig satisfy Equation (12) below $$\text{Max\_Csig} > \text{Csig}(c) > Vth2 > \text{Csig}(b) > Vth1 > \text{Csig}(a) > \text{Min\_Csig} \quad \text{Equation (12)}.$$

When Toff<t2, there is an overlap in the waveform of the capacitor voltage Csig. Thus, the resetting signal R of the SR latch circuit 400 does not become 0, and the output voltage Vout stays at Low. To avoid this situation, it is necessary to set the value of t2 in such a way as to avoid Toff<t2.

In the comparing circuit 10 shown in FIG. 2, a potential of the maximum charging voltage max_Csig becomes same as that of the Vcc (when a potential of the MP113 and a potential of the MP117 become same as that of the Vcc, the charging current becomes 0, and charging stops). In the same manner, a potential of the minimum charging voltage min_Csig becomes same as that of the GND, which is GND=0 (when a potential of the MN120 and a potential of the MN124 become same as that of the GND, the discharging current becomes 0, and discharging stops).

If, for example, values of Vcc, Vth2, Vth1, and GND in the comparing circuit 10 are set to Vcc=5 (V), Vth2=3 (V), Vth1=2 (V), and GND=0 (V), and values of Ia, Ib, Ic, Id, and C1 in the comparing circuit 10 shown in FIG. 2 are set to Ia=Ib=0.1 (uA), Ic=Id=10 (uA), and C1=10 (pF), then the delay times t1 and t2 in the waveforms shown in FIG. 3 take the following values, respectively $$\begin{aligned} t1 &= t\_AB + t\_BC + t\_CD \\ &= C1 \times Vth1/(Ia+Ic) + C1 \times (Vth2-Vth1)/Ia + \\ &\quad C1 \times Vth2/(Ia+Ic) \\ &= 10 \times 2/10.1 + 10 \times 1/0.1 + 10 \times 2/10.1 \\ &= 103.96 \text{ [usec]} \end{aligned}$$

$$\begin{aligned} t2 &= t\_EF + t\_FG + t\_GH \\ &= C1 \times Vth2/(Ib+Id) + C1 \times (Vth2-Vth1)/Ib + \\ &\quad C1 \times Vth1/(Ib+Id) \\ &= 10 \times 2/10.1 + 10 \times 1/0.1 + 10 \times 2/10.1 \\ &= 103.96 \text{ [usec]}. \end{aligned}$$

Therefore, when this setting with the values mentioned above is given, the delay time t1 from the time when a signal is input to the time when a signal is output is 103.96 (usec), and the delay time t2 from the time when inputting a signal stops (point E in FIG. 3) to the time when the capacitor voltage Csig drops to 0V is 103.96 (usec).

Accordingly, when signals are fed into the input section 11 continuously, pulse signals are supplied normally from the output section 503 if the time period Toff between a signal (High-level) and another signal (High-level) is t2=103.96 (usec) or longer.

Further, the currents Ia, Ib, Ic, Id to be supplied from the current sources 125-128 are constant currents. This allows the charging period and the discharging period to be set accurately.

Figure 6:
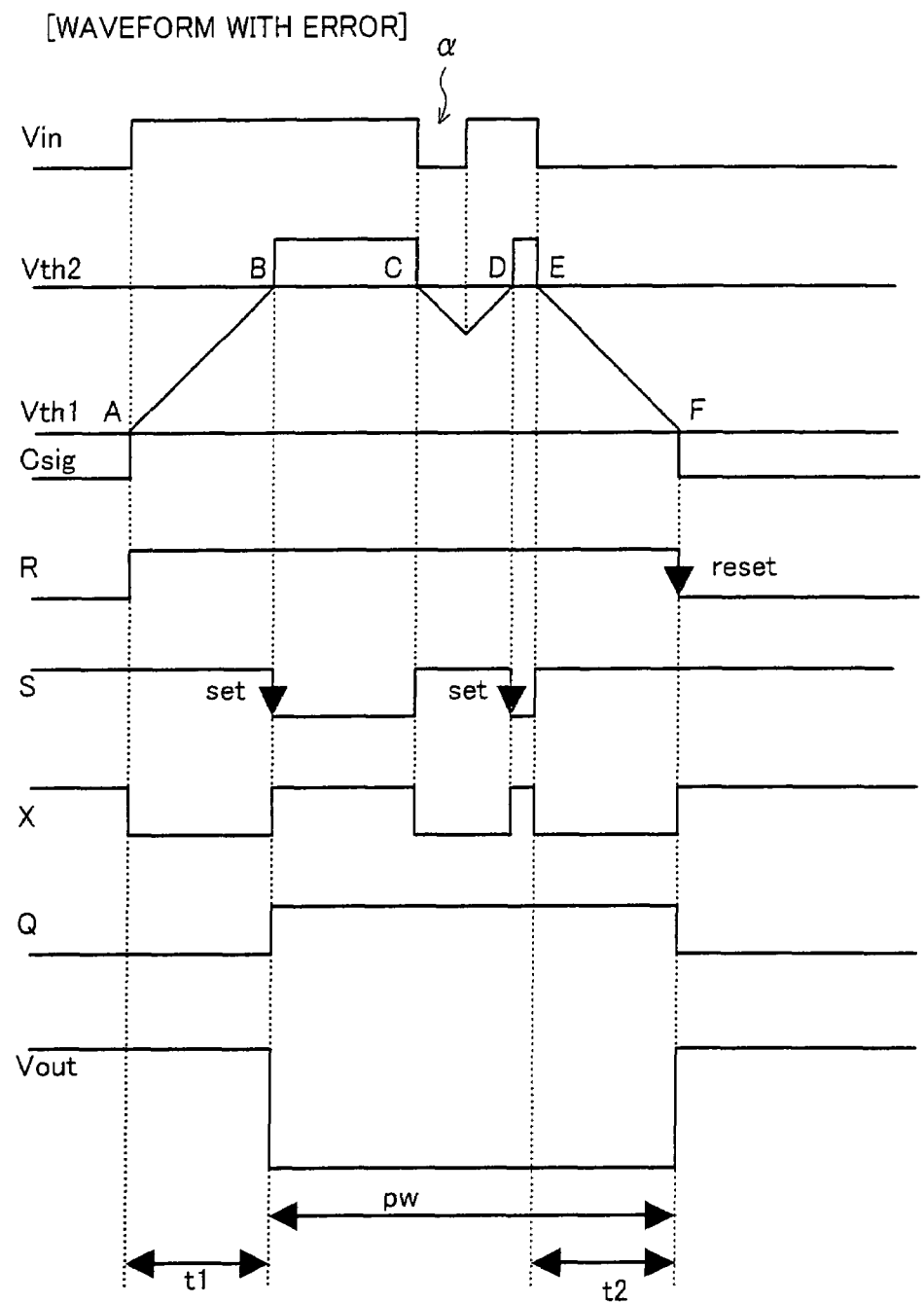
FIG. 6 is a timing chart showing waveforms in operations of the comparing circuit at the time when an error occurs.

The following describes prevention of errors in the comparing circuit 10 of the present embodiment, with reference to FIGS. 6 and 7. FIG. 6 shows waveforms in operations of the comparing circuit 10 at the time when an error occurs. FIG. 7 shows a truth table of the SR latch circuit 400 and the output circuit 500 at the time when an error occurs.

FIG. 6 shows waveforms containing a pulse-split (a in the figure), which indicates an error, during the period in which Vin=High. This pulse-split occurs due to noise or the like.

At the pulse-split in the input voltage Vin, the capacitor voltage Csig drops from point C to point D. However, the charging period and the discharging period are set long in period (b) so that the capacitor voltage Csig does not drop to below the threshold voltage Vth1. Thus, as shown in the waveforms and the truth table, output pulses of the output voltage Vout are output normally in the same manner as in the conventional circuit, even when there is a split in an input pulse of the input voltage Vin. Therefore, even if the input voltage Vin contains errors, errors in the output voltage Vout are prevented.

In a case where the charging current and the discharging current of the comparing circuit 10 of the present embodiment are same as those of the conventional circuit, the hysteresis voltage range increases if ΔVth=Vth2−Vth1 of the comparing circuit 10 with respect to the hysteresis voltage range (Vhis) of the conventional circuit is set in accordance with Equation (13) below $$\Delta Vth \geq Vhis \quad \text{Equation (13)}.$$

This makes it possible to maintain the same or improved capability of preventing errors, compared to the conventional circuit. The charging current and the discharging current of the comparing circuit 10 are same as those of the conventional circuit only during period (b).

The foregoing allows the comparing circuit 10 of the present embodiment to maintain the same or improved capability of preventing errors, compared to the conventional circuit, and at the same time, to improve in capability of outputting a pulse having a same period as that of an input pulse having a short pause period.

Further, in the comparing circuit 10 of the present embodiment, the charging period (charging current) and the discharging period (discharging current) in period (b) may be set equal to each other. Specifically, the charging period from point B to point C and the discharging period from point F to point G in FIG. 3 may be set equal. This is discussed in the following description, with reference to FIG. 3.

In period (b), the charging current is the current Ia, and the discharging current is the current Ib. If the currents Ia and Ib are set to Ia=Ib to make the charging period and the discharging period equal, a charging period Tbc from point B to point C in FIG. 3 is expressed by Equation (14) below $$\begin{aligned} Tbc &= (Vth2 - Vth1) \times C1/Ia \quad \text{Equation (14)} \\ &= t1. \end{aligned}$$

Further, a discharging period Tfg from point F to point G is expressed by Equation (15) below $$\begin{aligned} Tfg &= (Vth2 - Vth1) \times C1/Ib \quad \text{Equation (15)} \\ &= t2. \end{aligned}$$

Accordingly, Tbc=Tfg when Ia=Ib. In other words, t1=t2 when Ia=Ib. If the charging periods and the discharging periods from point A to point B, from point C to point D, from point E to point F, and from point G to point H (suppose that Ia<<Ic and Ib<<Id) are short enough to ignore, then t1=t2. Therefore, the input voltage Vin and the output voltage Vout become equal in pulse width.

Accordingly, setting the charging period and the discharging period equal, i.e. Ia=Ib, allows the comparing circuit 10 to output an output pulse having a same pulse width as that of an input pulse.

To set an initial state at the time when the power source is given, the comparing circuit 10 of the present embodiment may include an initializing circuit 600. This is discussed in the following description, with reference to FIGS. 8, 9(a), and 9(b).

Figure 8:
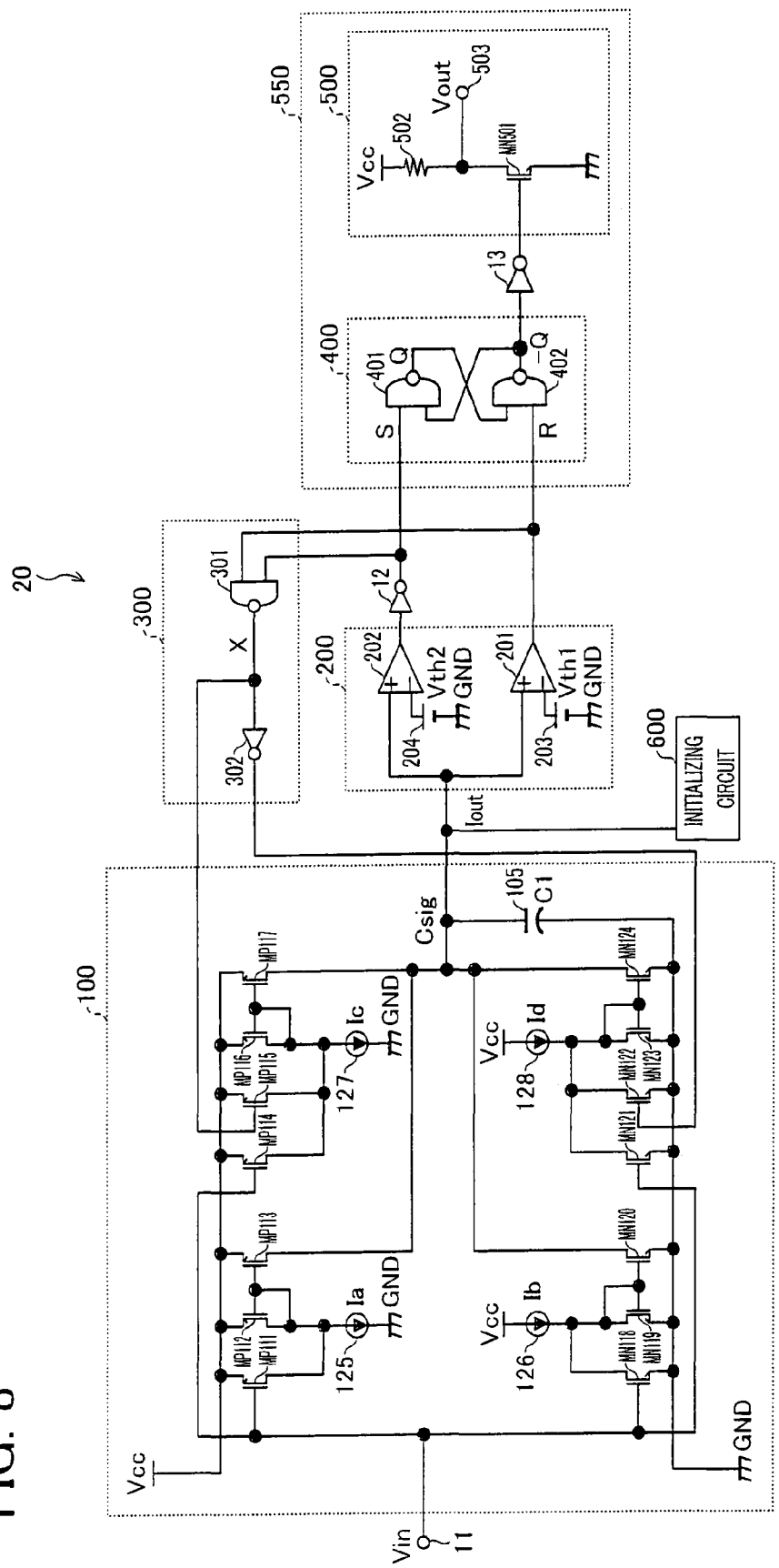
FIG. 8 is a circuit diagram showing another exemplary configuration of the comparing circuit.
Figure 9:
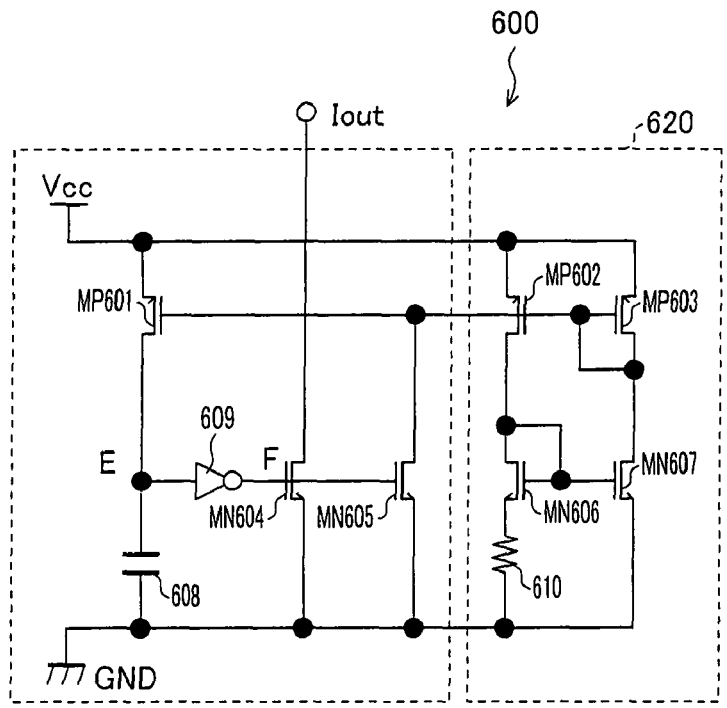
FIG. 9($a$) is a circuit diagram showing an exemplary configuration of an initializing circuit.
Figure 9:
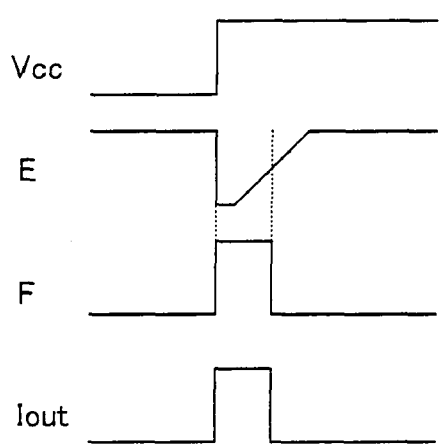

FIG. 8 is a circuit diagram showing an exemplary configuration of a comparing circuit 20 including the initializing circuit 600. FIG. 9(a) is a circuit diagram showing an exemplary and concrete configuration of the initializing circuit 600. FIG. 9(b) shows waveforms in operations of the initializing circuit 600 at the time when the power source is given. In the figures, "E" indicates a capacitor-voltage of the capacitor 608, "F" indicates an output signal of the NOT gate 609, that is, a signal to be applied to a gate of the MN604, and "Iout" indicates an output current of the initializing circuit 600.

The comparing circuit 20 includes, in addition to the configuration of the comparing circuit 10, an initializing circuit 600.

As shown in FIG. 9(a), the initializing circuit 600 includes MP601 to MP603, MN604 to MN607, a capacitor 608, a NOT gate 609, and a resistor 610. The MP602, the MP603, the MN606, the MN607, and the resistor 610 constitute the constant-current circuit 620.

When the power source is given (Vcc=High), current is drawn from the capacitor 608, and the capacitor 608 is discharged completely. Thus, the capacitor voltage of the capacitor 608 becomes E=Low, as shown in the waveforms in FIG. 9(b). At this time, the output signal of the NOT gate 609, into which the capacitor voltage E of the capacitor 608 is fed, becomes F=High.

When the power source is given, and the constant-current circuit 620 starts operating, the MP601 becomes ON. Thus, the capacitor 608 is charged, and the capacitor voltage E rises. As the capacitor voltage E rises, the output signal F drops to Low. Only when the output voltage F is High, the MN604 and the MN605 are ON, and the output current Iout flows.

For example, as shown in FIG. 8, in the case in which the capacitor voltage Csig of the comparing circuit 20 at the time when the power source is given is set to 0, it is sufficient to draw a current of Iout from the capacitor 105 only for a short period at the time when the power source is given.

Accordingly, the comparing circuit 20 includes the initializing circuit 600 so that an initial setting is given when the power source is given. This allows the waveforms to be processed stably when the power source is given.

Further, if the first threshold voltage (Vth1) and the second threshold voltage (Vth2) of the comparator circuit 200 do not satisfy Vth1<Vth2 in the comparing circuit 10 of the present embodiment due to fluctuations in processes and/or variations in devices, the comparing circuit 10 cannot operate normally.

Figure 10:
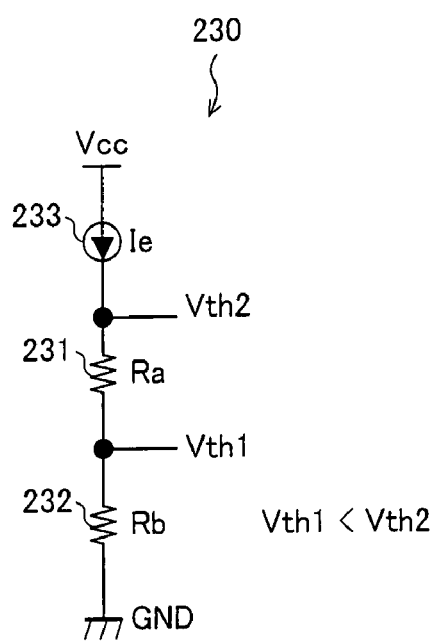
FIG. 10 is a circuit diagram showing an exemplary configuration of a threshold-voltage generating circuit.

To avoid this problem, the threshold voltages Vth1 and Vth2 of the comparator circuit 200 are generated by utilizing a voltage drop in a resistor. This is discussed in the following description, with reference to FIG. 10. FIG. 10 is a circuit diagram showing an exemplary and concrete configuration of the threshold-voltage generating circuit 230.

As shown in FIG. 10, the threshold-voltage generating circuit 230 includes: a resistor 231 (resistance Ra); a resistor 232 (resistance Rb); and a current source 233 to generate a constant-current Ie. The power source, the current source 233, the resistor 231, the resistor 232, and the GND are connected serially in the order as listed. The threshold voltage Vth2 is taken out from somewhere in between the current source 233 and the resistor 231. The threshold voltage Vth1 is taken out from somewhere in between the resistor 231 and the resistor 232.

The values of the threshold voltages are expressed by Equations (16) and (17) below, respectively $$Vth1 = Rb \times Ie \qquad \text{Equation (16)}$$

$$Vth2 = (Ra+Rb) \times Ie \qquad \text{Equation (17).}$$

Therefore, Vth1<Vth2 are always satisfied, and ΔVth=Ra×Ie.

With the threshold-voltage generating circuit 230, Vth1<Vth2 is always satisfied in the comparing circuit 10.

Embodiment 2

Figure 11:
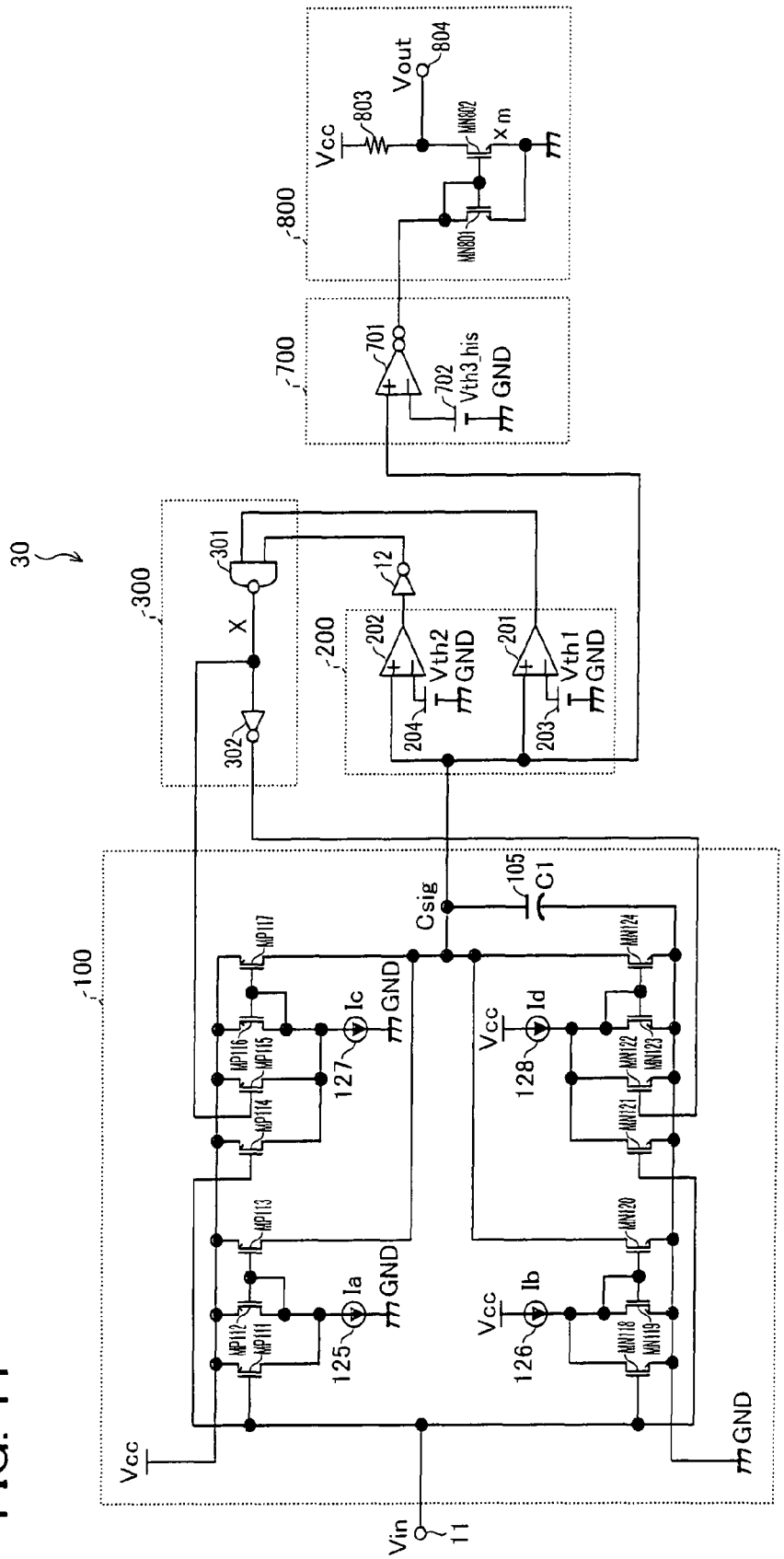
FIG. 11 is a circuit block diagram of a comparing circuit of another embodiment of the present invention.
Figure 12:
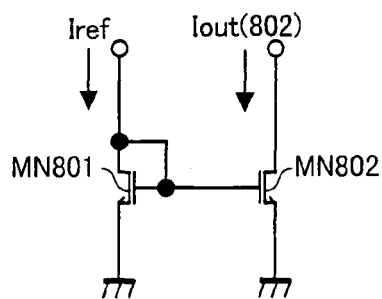
FIG. 12($a$) is a circuit diagram of the comparing circuit including an output circuit, with a ratio of currents at a current mirror being set.
Figure 12:
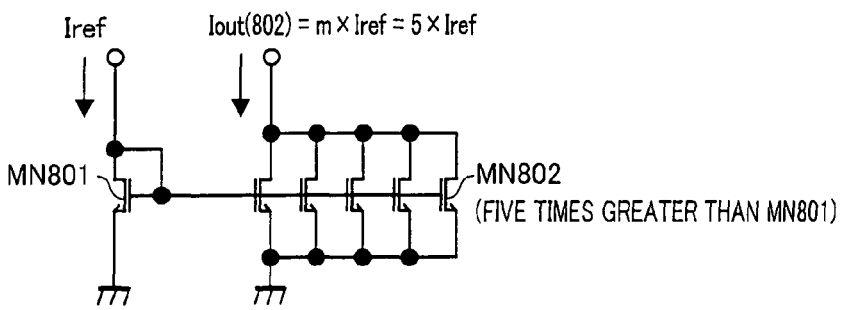

The following describes another embodiment of the present invention, with reference to FIGS. 11 to 19. Configurations other than those described in the present embodiment are same as those in Embodiment 1. For convenience in description, components having the same functions as those of the components shown in the figures of Embodiment 1 are given the same reference numerals, and description thereof is omitted. FIG. 11 is a circuit diagram showing an exemplary configuration of a comparing circuit 30.

As shown in FIG. 11, the comparing circuit 30 of the present embodiment includes an input section 11, a NOT gate 12, a charging and discharging circuit 100, a comparator circuit 200, a logical operation circuit 300, a hysteresis comparator circuit 700 being a second comparator circuit, and an output circuit 800 being an output-signal generating circuit.

The comparing circuit 30 of the present embodiment utilizes the comparator circuit 200 to adjust the values of the charging current and the discharging current of the charging and discharging circuit 100. The comparing circuit 30 outputs the output voltage Vout on the basis of a result of comparison of the capacitor voltage Csig with a third threshold voltage (Vth3_his) (hysteresis voltage). The third threshold voltage is set in the hysteresis comparator circuit 700 and has a hysteresis characteristic.

The hysteresis comparator circuit 700 includes a comparator circuit section 701 and a reference power-source 702 generating the third threshold voltage Vth3_his. The hysteresis comparator circuit 700 compares the capacitor voltage Csig of the charging and discharging circuit 100 with the third threshold voltage Vth3_his. If the capacitor voltage Csig is higher than the third threshold voltage Vth3, then the comparator circuit section 701 generates a High-signal and supplies the output circuit 800 with the High-signal. If the capacitor voltage Csig is lower than the third threshold voltage Vth3, then the comparator circuit section 701 generates a Low-signal and supplies the output circuit 800 with the Low-signal. In other words, the comparator circuit section 701 generates a pulse signal (second pulse signal) of High-level or Low-level and supplies the output circuit 800 with the pulse signal.

Figure 24:
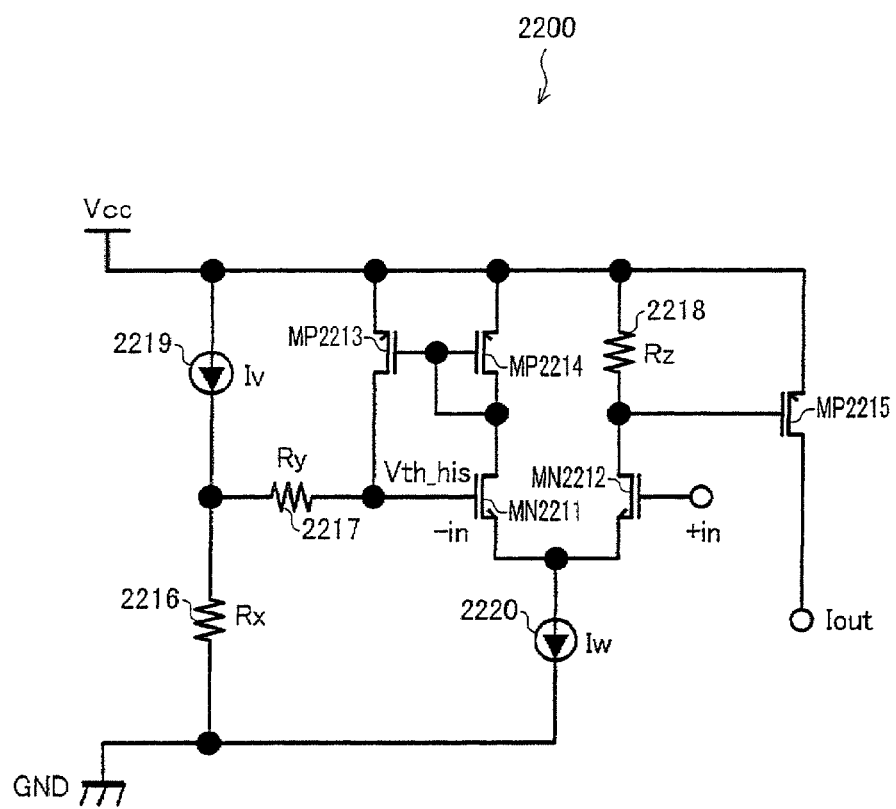
FIG. 24 is a circuit diagram showing an exemplary configuration of the conventional hysteresis comparator circuit.
Figure 25:
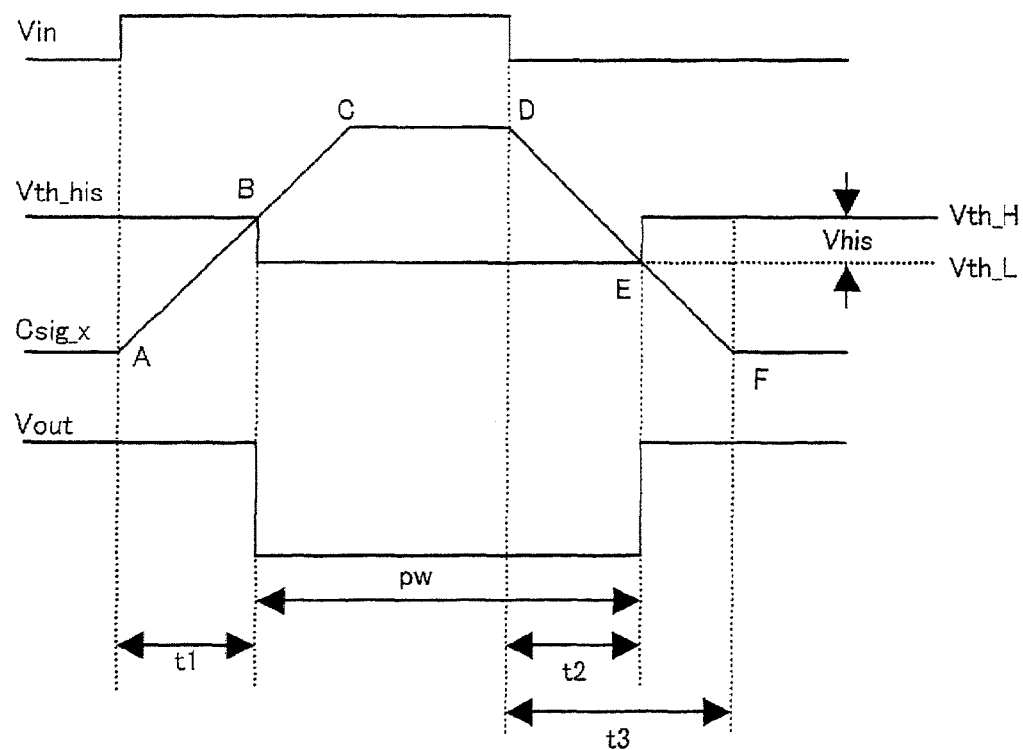
FIG. 25 is a timing chart showing waveforms in operations of the conventional comparing circuit.
Figure 26:
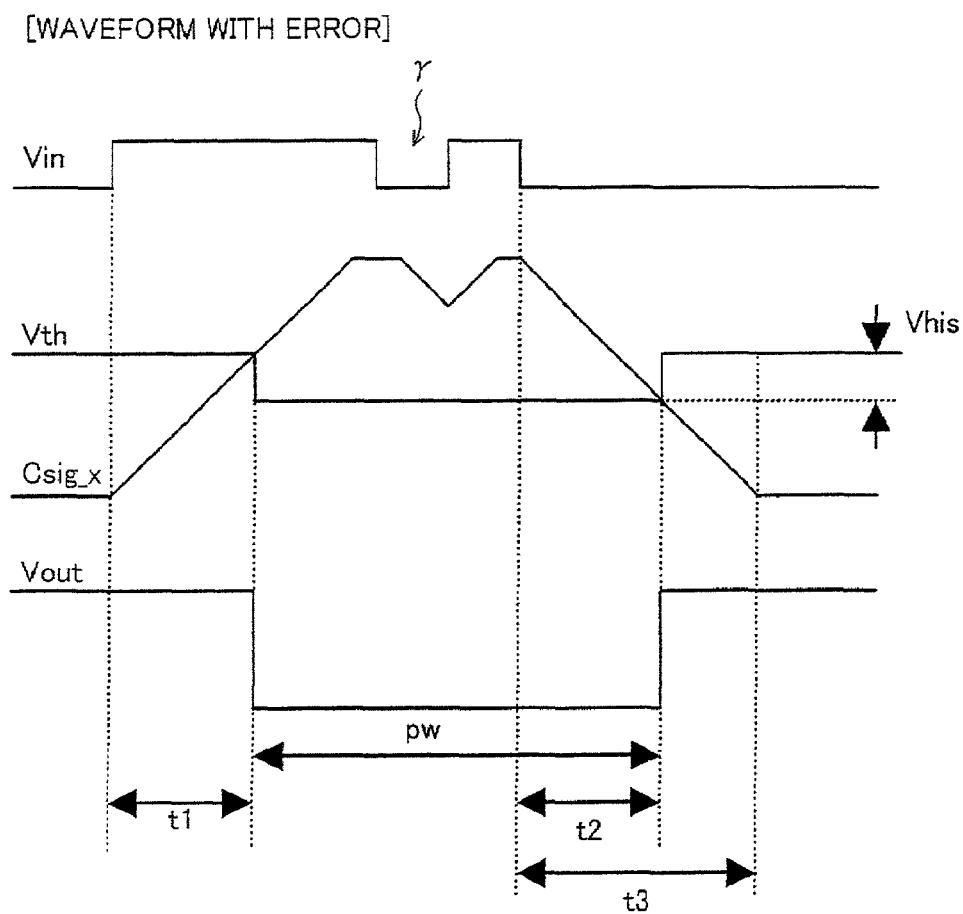
FIG. 26 is a timing chart showing waveforms in operations of the conventional comparing circuit at the time when an error occurs.

The details of the configuration of the hysteresis comparator circuit 700 may be same as that of the conventional circuit shown in FIG. 24. It is possible to suitably use a commonly-used hysteresis comparator circuit.

Principles of operations of the hysteresis comparator circuit 700 are same as those of the conventional circuit. In the comparing circuit 30 of the present embodiment, the third threshold voltage Vth3_his is set in such a way as to satisfy the following condition $$Vth1<Vth3\_L<Vth3\_H<Vth2 \qquad \text{Equation (18)}$$

(where "H" in Vth3_H indicates High, and "L" in Vth3_L indicates Low).

The output circuit 800 includes an MN801, an MN802, a resistor 803, and an output section 804. A drain of the MN801 is connected to the hysteresis comparator circuit 700. A gate of the MN 801 is connected to the drain of the MN801 and to a gate of the MN802. A source of the MN801 is grounded. A drain of the MN802 is connected to the output section 804. The drain of the MN802 is also connected to the power source via the resistor 803. A source of the MN802 is grounded.

The output circuit 800 outputs, via the output section 804, an output pulse signal, i.e. an output voltage (Vout), in response to an output signal supplied from the hysteresis comparator circuit 700. Specifically, when a High-signal is fed, the MN801 and the MN802 become ON, and the output voltage Vout becomes Low (=GND). On the other hand, when a Low-signal is fed, the MN801 and the MN802 become OFF, and the output voltage Vout becomes High (=Vcc).

The MN801 and the MN802 form a current mirror. This is discussed in the following description, with reference to FIGS. 12(a) and 12(b).

FIG. 12(a) is a circuit diagram showing a current mirror formed by the MN801 and the MN802, with a ratio of currents at the current mirror being set. FIG. 12(b) is a circuit diagram showing a current mirror formed by the MN801 and the MN802, with five MOS devices of a same size being connected.

The ratio of currents at the current mirror formed by the MN801 and the MN802 is set to 1:m. In a case where a reference current (Iref) flows through the MN801 as shown in FIG. 12(a), a current (Iout (802)) equal to the reference current (Iref) multiplied by m is output from the drain of the MN802. At this time, the current Iout (802) is expressed by Equation (19) below $$Iout(802)=Iref\times(W2/L2)/(W1/L1) \qquad \text{Equation (19)}$$

(where L1 indicates a gate length of the MN801, L2 indicates a gate length of the MN802, W1 indicates a gate width of the MN801, and W2 indicates a gate width of the MN802).

Accordingly, setting the gate length or the gate width to a suitable value makes it possible to obtain the current Iout (802) multiplied by m.

Further, as shown in FIG. 12(b), connecting five MOS devices of a same size makes it possible to obtain a current that is highly accurate.

Accordingly, in the comparing circuit 30, the current mirror circuit of the output circuit 800 multiplies the output current of the hysteresis comparator circuit 700 by m so that output current drive capabilities are improved.

Figure 13:
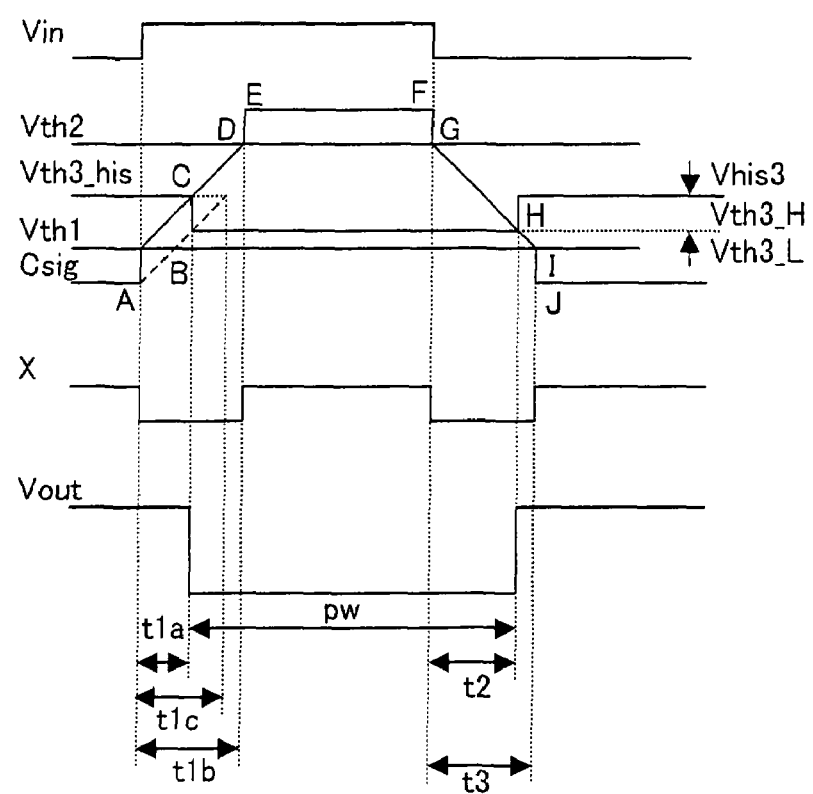
FIG. 13 is a timing chart showing waveforms in operations of the comparing circuit.
Figure 14:
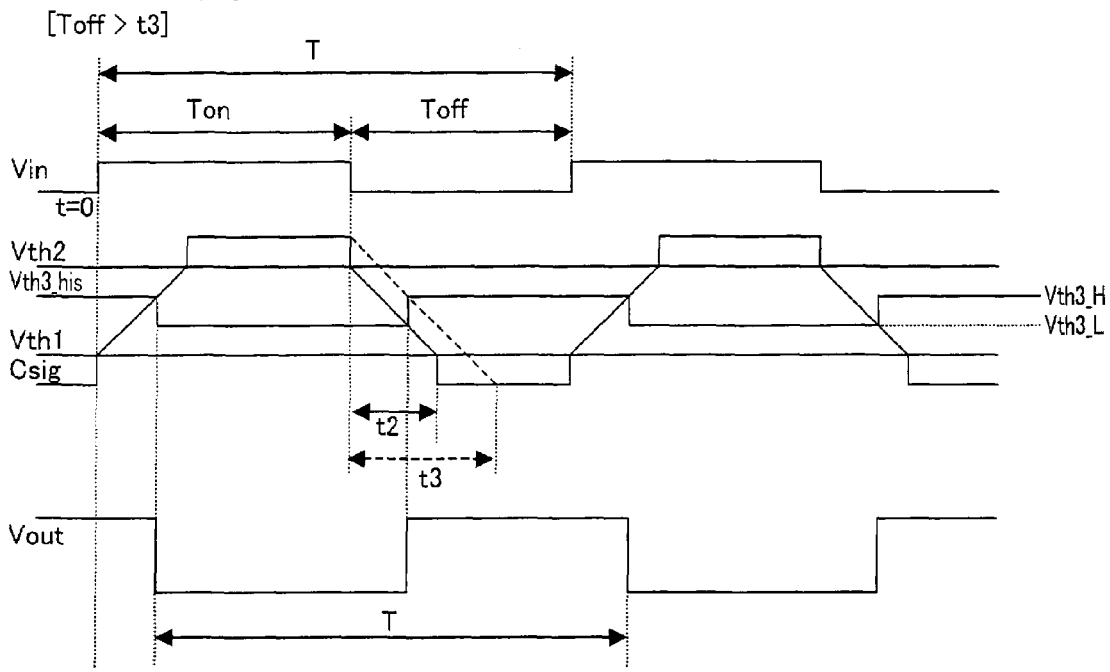
FIG. 14(a) is a timing chart showing waveforms in operations of the comparing circuit at the time when pulses are supplied continuously and Toff>t3.
FIG. 14(b) is a timing chart showing waveforms in operations of the comparing circuit at the time when pulses are supplied continuously and t2<Toff<t3.
Figure 14:
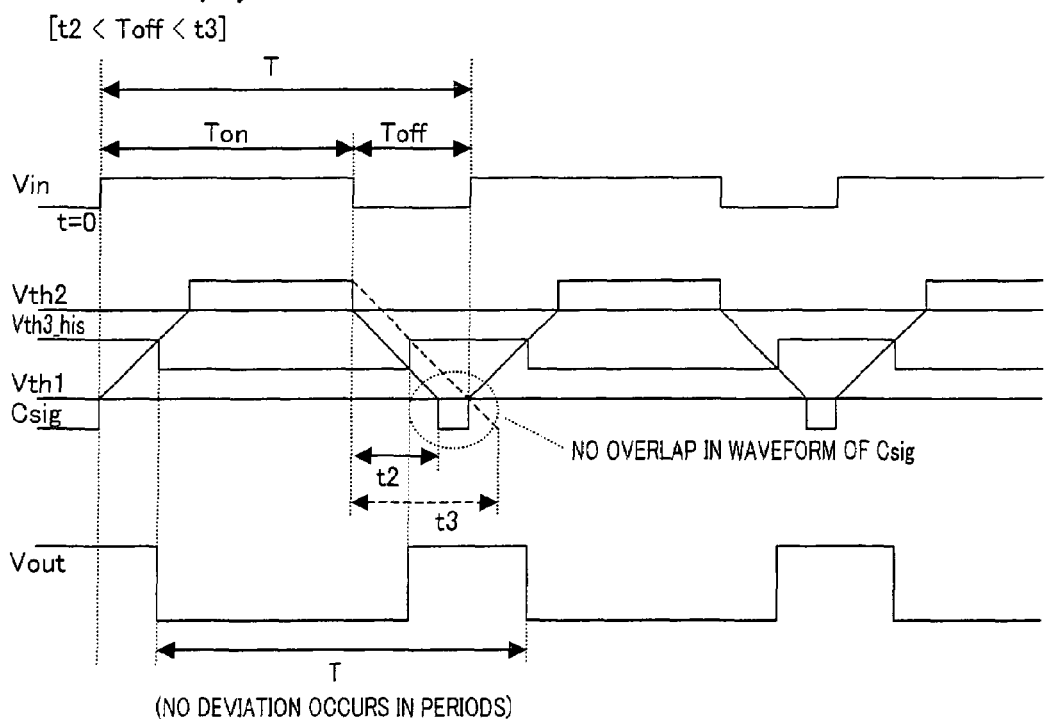

The following describes operations in the comparing circuit 30 of the present embodiment, with reference to FIG. 13.

FIG. 13 shows waveforms in operations of the comparing circuit 30. In the figure, "Vth3_his" indicates the third threshold voltage, "Vth3_H" indicates High, "Vth3_L" indicates Low, and "Vhis3" indicates a hysteresis voltage range. A period from the time when a pulse is fed into the input section 11 at time t=0 to the time when the output voltage Vout reverses to Low is indicated as "t1a" in the case of the comparing circuit 30 of the present embodiment, and indicated as "t1c" in the case of the conventional circuit. A period of time for the capacitor voltage Csig to rise to the threshold voltage Vth2 as a result of charging is indicated as "t1b". Further, "t2" indicates a delay time in a response of an output pulse to a drop of an input pulse, and "pw" indicates a pulse width. Further, "t3" indicates a period from the time when the capacitor-voltage of the conventional circuit is fully charged to saturation to the time when it is discharged completely. The dashed line indicates waveforms in operations of the conventional circuit.

Basic operations are same as those in the comparing circuits 10 and 20 of the embodiment above. When Vin=High, the capacitor 105 is charged. When Vin=Low, the capacitor 105 is discharged.

Note, however, that the charging and discharging operations of the capacitor voltage Csig are same as those in the embodiment above, but the capacitor voltage Csig becomes Csig>Vth3_H at point C. Consequently, Vth3_H drops to Vth3_L, and the output voltage Vout becomes Vout=Low. Thereafter, when the capacitor voltage Csig passes through points D-G and then reaches point H, the capacitor voltage Csig becomes Csig<Vth3_L. Consequently, Vth3_L rises to Vth3_H, and the output voltage Vout becomes Vout=High.

With reference to FIGS. 14(a) and 14(b), the following describes waveforms in operations at the time when an input voltage Vin with a pulse having a time period T is fed into the input section 11 continuously from time t=0.

FIG. 14(a) shows waveforms in operations at the time when Toff>t3 and pulses are fed continuously. FIG. 14(b) shows waveforms in operations at the time when t2<Toff<t3 and pulses are fed continuously.

As shown in FIG. 14(a), when Toff>t3, there is no overlap in the waveforms in the operations of the comparing circuit 30 and in the waveforms in the operations of the conventional circuit, and the output voltage Vout is output normally.

As shown in FIG. 14(b), when t2<Toff<t3, there is an overlap in the waveform of the capacitor voltage Csig of the conventional circuit. On the other hand, there is no overlap in the waveforms in the operations of the present embodiment, and the output voltage Vout is output normally.

Note that, in the same manner as in Embodiment 1, t2, t3, and Δt are same as those expressed by Equations (8) to (10), and t2<t3 is satisfied.

Accordingly, the comparing circuit 30 of the present embodiment improves in capability of outputting a pulse having a same period as that of an input pulse having a shorter Toff than the conventional circuit. In other words, the comparing circuit 30 improves in capability of outputting a pulse having a same period as that of an input pulse having a short pause period. Thus, it is possible to output a pulse having a same period as that of an input pulse having a pause period shortened by Δt of Equation (10).

The capacitor 105 is charged when Vin=High and discharged when Vin=Low in the comparing circuit 30 of the present embodiment. The threshold voltages Vth1 and Vth2 are set, and the capacitor voltage Csig in charging and discharging is divided into the following three periods (a) Csig<Vth1, (b) Vth1<Csig<Vth2, and (c) Csig<Vth2. The value of the charging current to flow into the capacitor 105 and the value of the discharging current to flow into the capacitor 105 are changed by the comparing circuit 30 so as to be responsive to the respective periods.

Specifically, in FIG. 13, period (a) is the period from point A to point B and the period from point I to point J, period (b) is the period from point B to point D via point C and the period from point G to point I via point H, and period (c) is the period from point D to point G via points E and F.

During the period from point B to point D via point C and the period from point G to point I via point H, the currents Ic and Id do not contribute to the charging current and the discharging current. Therefore, if the currents are set to satisfy Ia<<Ic and Ib<<Id, the charging period and the discharging period other than the period from point B to point D via point C and the period from point G to point I via point H are shortened rapidly.

This makes it possible to shorten rapidly the period from point F to point G, among the periods of the delay time t2 constituted of the period from point F to point G and the period from point G to point H. This allows the delay time t2 to be shortened. Accordingly, it becomes possible to output accurately a pulse having a same period as that of an input pulse having a short pause period.

FIG. 13 shows the waveforms of a case in which the charging period and the discharging period are set short in periods (a) and (c) and relatively long in period (b).

When Toff<t2, there is an overlap in the waveform of the capacitor voltage Csig. Thus, there is a possibility that the period of the output pulse becomes shorter than that of the input pulse. To avoid this situation, it is necessary to set the value of t2 in such a way as to avoid Toff<t2.

Figure 15:
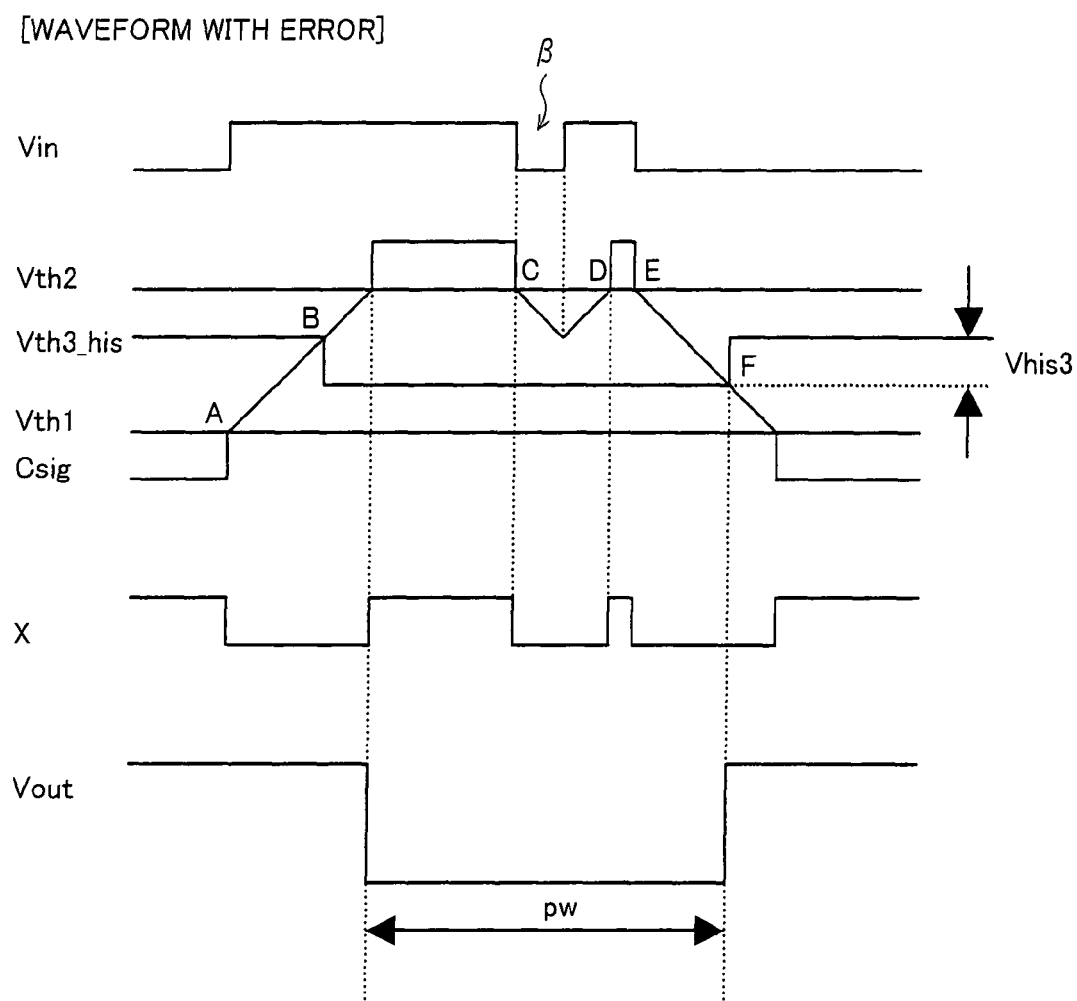
FIG. 15 is a timing chart showing waveforms in operations of the comparing circuit at the time when an error occurs.

The following describes prevention of errors in the comparing circuit 30 of the present embodiment, with reference to FIG. 15. FIG. 15 shows waveforms in operations of the comparing circuit 30 at the time when an error occurs.

FIG. 15 shows a waveform containing a pulse-split (β in the figure), which indicates an error, during the period in which Vin=High. This pulse-split occurs due to noise or the like.

At the split-pulse in the input voltage Vin, the capacitor voltage Csig drops from point C to point D. However, the charging period and the discharging period are set long during period (b) so that the capacitor voltage Csig does not drop until period (a). Thus, as shown in the waveform, output pulses of the output voltage Vout are output normally in the same manner as in the conventional circuit, even when there is a pulse-split in an input pulse of the input voltage Vin. Therefore, even if the input voltage Vin contains errors, errors in the output voltage Vout are prevented.

In a case where the charging current and the discharging current of the comparing circuit 30 of the present embodiment are same as those of the conventional circuit, the hysteresis voltage range increases if the hysteresis voltage range (Vhis3) of the comparing circuit 30 with respect to the hysteresis voltage range (Vhis) of the conventional circuit is set in accordance with Equation (20) below $$Vhis3 \geq Vhis \qquad \text{Equation (20).}$$

This makes it possible to maintain the same or improved capability of preventing errors, compared to the conventional circuit. The charging current and the discharging current of the comparing circuit 30 are same as those of the conventional circuit only during period (b).

The foregoing allows the comparing circuit 30 of the present embodiment to maintain the same or improved capability of preventing errors, compared to the conventional circuit, and at the same time, to improve in capability of outputting a pulse having a same period as that of an input pulse having a short pause period.

Figure 16:
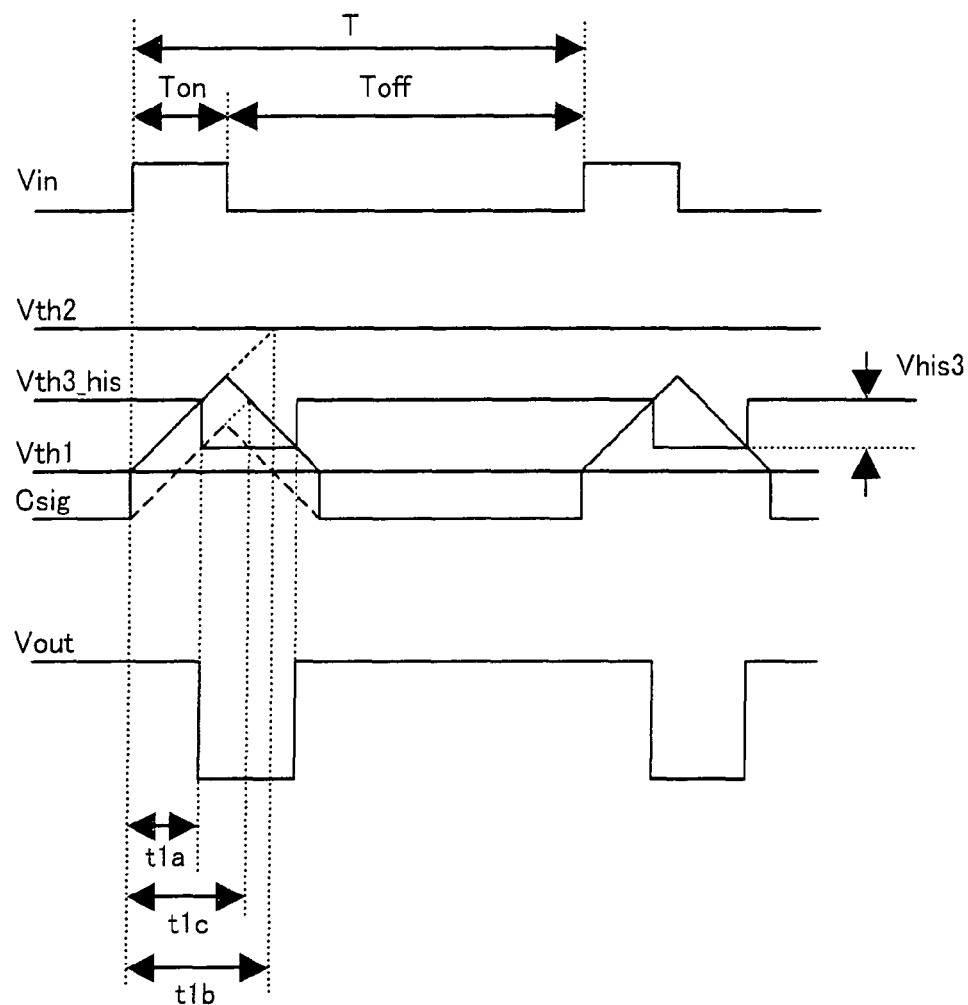
FIG. 16 is a timing chart showing waveforms in operations of the comparing circuit at the time when pulses with short widths are supplied.

The following describes advantages of the comparing circuit 30 of the present embodiment, with reference to FIG. 16. FIG. 16 shows waveforms in operations at the time when t1a<Ton<t1c<t1b. The dashed line indicates a waveform in an operation of the conventional circuit. The dotted line indicates a waveform in an operation of the comparing circuit 10 of the embodiment above.

In the comparing circuit 30, t1a, t1b, and t1c in FIG. 13 are expressed by Equations (21) to (23) below, respectively $$t1a = (Vth3\_H - Vth1) \times C1 / Ia \qquad \text{Equation (21)}$$

$$t1b = (Vth2 - Vth1) \times C1 / Ia \qquad \text{Equation (22)}$$

$$t1c = (Vth\_H - 0) \times C1 / Ia \qquad \text{Equation (23)}$$
$$= Vth\_H \times C1 / Ia,$$

where Vth_H indicates the hysteresis voltage (High) of the conventional circuit. Further, when Vth3_H=Vth_H, $$t1a<t1c<t1b \qquad \text{Equation (24).}$$

FIG. 16 shows waveforms at the time when pulses having a short pulse width satisfying t1a<Ton<t1c<t1b are fed into the input section 11.

In the comparing circuit 10 of the embodiment above, the capacitor voltage Csig does not become Csig>Vth2, and the output voltage Vout does not reverse into Low. Similarly, in the conventional circuit, the capacitor voltage Csig does not become Csig>Vth_H if Vth3_H=Vth_H, and the output voltage Vout does not reverse into Low.

However, in the comparing circuit 30 of the present embodiment, the capacitor voltage Csig becomes Csig>Vth3_H, and the output voltage Vout reverses into Low. At this time, Δtb, which is a result of comparison of t1a with t1b, is expressed by Equation (25) below, and Δtc, which is a result of comparison of t1a with t1c, is expressed by Equation (26) below $$\Delta tb = t1b - t1a \qquad \text{Equation (25)}$$
$$= (Vth2 - Vth3\_H) \times C1 / Ia$$

$$\Delta tc = t1c - t1a \qquad \text{Equation (26)}$$
$$= (Vth\_H - Vth3\_H + Vth1) \times C1 / Ia$$
$$= Vth1 \times C1 / Ia.$$

The comparing circuit 30 of the present embodiment improves in capability of outputting an input pulse having a short pulse width satisfying t1a<Ton<t1c<t1b, compared to the conventional circuit and the comparing circuit 10 of the embodiment above. The comparing circuit 30 improves in responsiveness to an input pulse with a short period by Δtb compared to the comparing circuit 10 of the above-discussed embodiment, and by Δtc compared to the conventional circuit. In other words, responsiveness to an input pulse having a short period also improves.

The foregoing allows the comparing circuit 30 of the present embodiment to improve in capability of outputting an input pulse having a short period and a short pulse width.

Figure 17:
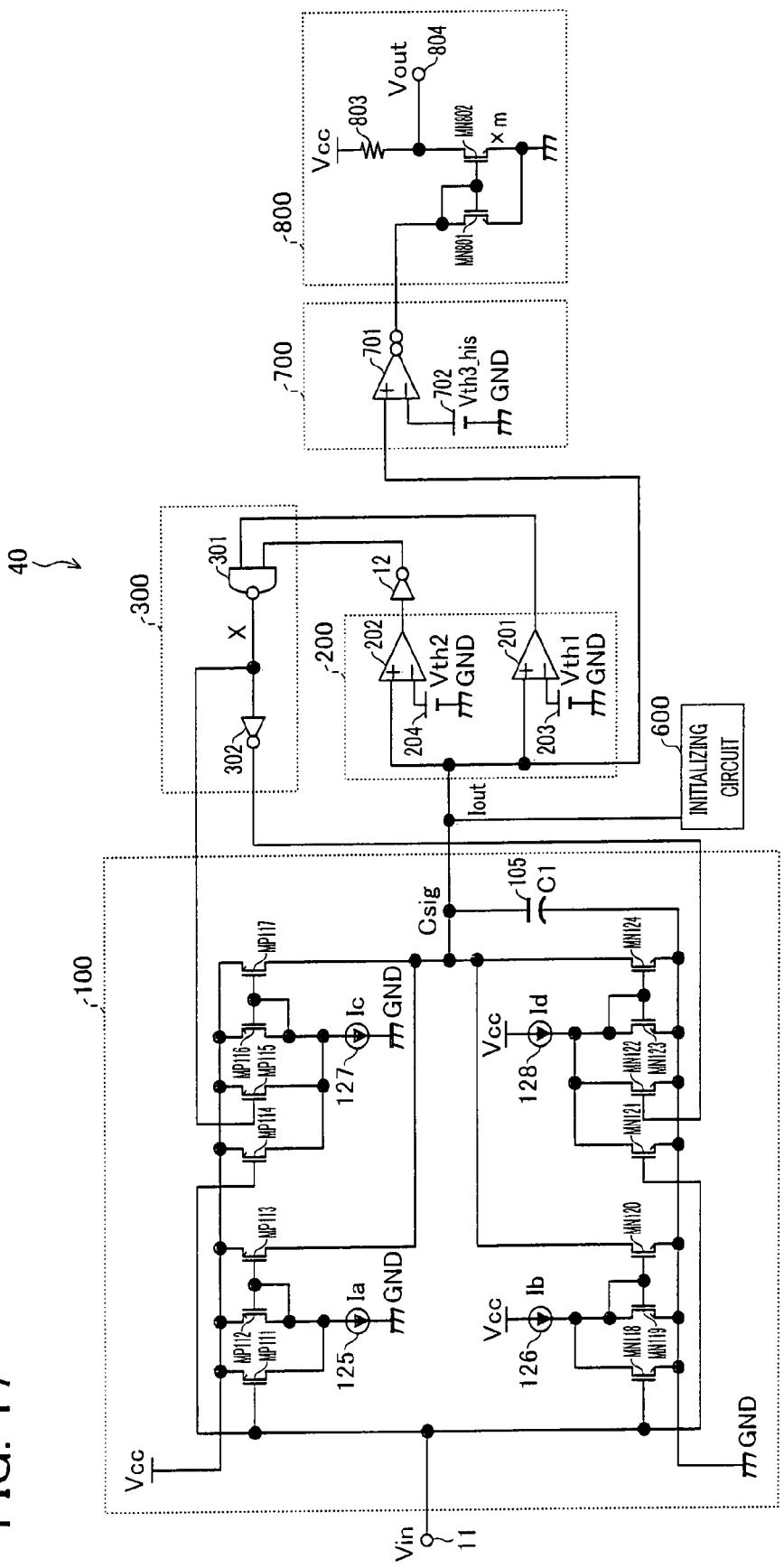
FIG. 17 is a circuit diagram showing another exemplary configuration of the comparing circuit.

The comparing circuit 30 of the present embodiment may include an initializing circuit 600 to set an initial state at the time when the power source is given. This is discussed in the following description, with reference to FIG. 17. FIG. 17 is a circuit diagram showing an exemplary configuration of a comparing circuit 40 including the initializing circuit 600.

The comparing circuit 40 includes, in addition to the configuration of the comparing circuit 30, the initializing circuit 600. The comparing circuit 40 includes the initializing circuit 600 so that an initial setting is given when the power source is given, in the same manner as in the comparing circuit 20 of the embodiment above. This allows the waveforms to be processed stably when the power source is given, in the same manner as in the comparing circuit 20 of the embodiment above.

Further, the comparing circuit 30 of the present embodiment cannot operate normally when the first threshold voltage (Vth1) and the second threshold voltage (Vth2) of the comparator circuit 200 and the third threshold voltage (Vth3_his) of the hysteresis comparator circuit 700 do not satisfy Vth1<Vth3_his<Vth2 due to fluctuations in processes and/or variations in devices, in the same manner as in the comparing circuit 10 of the embodiment above.

Figure 18:
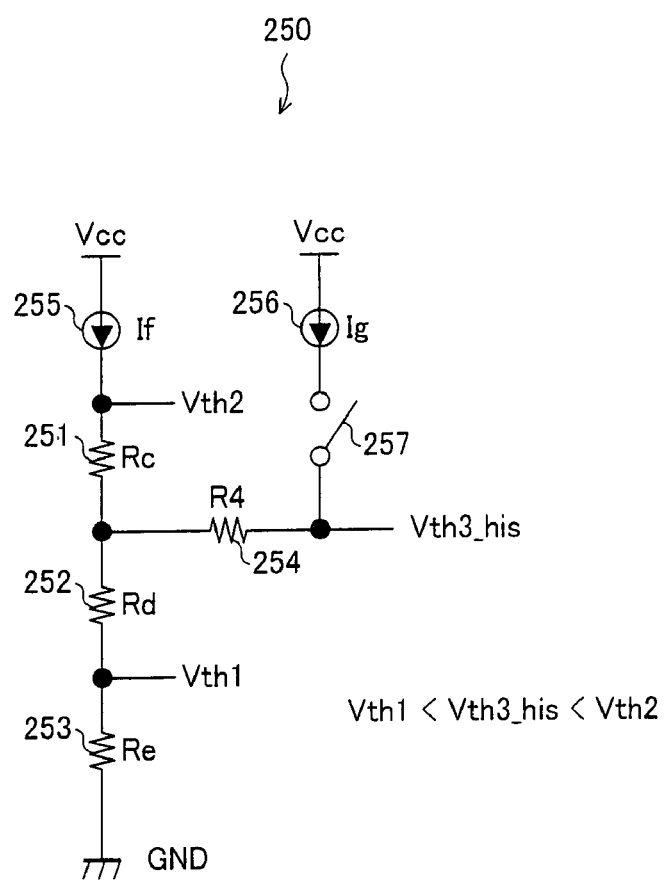
FIG. 18 is a circuit diagram showing another exemplary configuration of the threshold-voltage generating circuit.

To avoid this problem, the threshold voltages Vth1 and Vth2 of the comparator circuit 200 and the threshold voltage Vth3_his of the hysteresis comparator circuit 700 are generated by utilizing a voltage drop in a resistor. This is discussed in the following description, with reference to FIG. 18. FIG. 18 is a circuit diagram showing an exemplary and concrete configuration of the threshold-voltage generating circuit 250.

As shown in FIG. 18, the threshold-voltage generating circuit 250 includes: a resistor 251 (resistance Rc); a resistor 252 (resistance Rd); a resistor 253 (resistance Re); a resistor 254 (resistance Rf); a current source 255 to generate a constant-current If; a current source 256 to generate a constant-current Ig; and a switch 257.

The power source, the current source 255, the resistor 251, the resistor 252, the resistor 253, and the GND are connected serially in the order as listed. The threshold voltage Vth2 is taken out from somewhere in between the current source 255 and the resistor 251. The threshold voltage Vth1 is taken out from somewhere in between the resistor 252 and the resistor 253. Further, the resistor 254 is connected across the resistor 251 and the resistor 252. The threshold voltage Vth3_his is taken out via the resistor 254. The switch 257 is connected across the resistor 254 and the hysteresis comparator circuit 700. The current source 256 is connected to the switch 257, and the power source is connected to the current source 256.

The threshold voltages at this time are as follows.

[1] Case in which Csig<Vth3_his=Vth3_H (equivalent to the threshold-voltage generating circuit 250 at the time when the switch 257 is ON)

In this case, the constant-current Ig flows through a path from the resistor 254 to the GND via the resistor 252 and via the resistor 253.

$$Vth1 = Vth1\_H$$
$$= Re \times (If + Ig)$$
$$= Re \times If \times Re \times Ig$$

$$Vth2 = Vth2\_H$$
$$= (Rd + Re) \times (If + Ig) + Rc \times If$$
$$= (Rc + Rd + Re) \times If + (Rd + Re) \times Ig$$

$$Vth3\_his = Vth3\_H$$
$$(Rd + Re) \times (If + Ig) + Rf \times Ig$$
$$(Rd + Re) \times If + (Rd + Re + Rf) \times Ig$$

To satisfy Vth1<Vth3_his<Vth2, however, it is necessary to set the resistances and the currents in such a way as to satisfy Rc×If>Rf×Ig.

[2] Case in which Csig<Vth3_his=Vth3_L (equivalent to the threshold-voltage generating circuit 250 at the time when the switch 257 is OFF)

In this case, the constant-current Ig does not flow through the path.

$$Vth1 = Vth1\_L$$
$$= Re \times If$$

$$Vth2 = Vth2\_L$$
$$= (Rc + Rd + Re) \times If$$

$$Vth3\_his = Vth3\_L$$
$$= (Rd + Re) \times If$$

Thus, Vth1<Vth3_his<Vth2 are always satisfied in this case.

Figure 19:
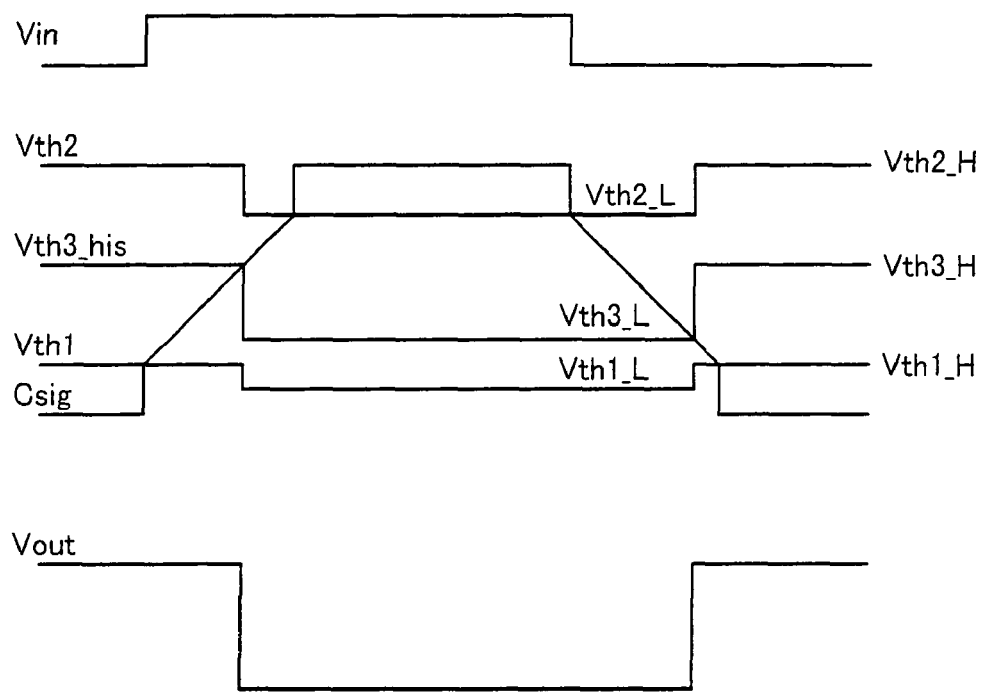
FIG. 19 is a timing chart showing waveforms in operations, showing a hysteresis voltage range of the comparing circuit.

The following describes a hysteresis voltage range of each of the threshold voltages Vth1, Vth2, and Vth3_his, with reference to FIG. 19. FIG. 19 shows hysteresis voltage ranges in the waveforms in operations of the comparing circuit 30.

From [1] and [2] above, the hysteresis voltage range of the threshold voltage Vth1 (Vhis1), the hysteresis voltage range of the threshold voltage Vth2 (Vhis2), and the hysteresis voltage range of the threshold voltage Vth3_his (Vhis3) take the values below, respectively:

$$Vhis1 = Re \times Ig$$
$$Vhis2 = (Rd + Re) \times Ig$$
$$Vhis3 = (Rc + Rd + Re) \times Ig.$$

Therefore, Vhis1<Vhis2<Vhis3. In this case, Vth1_H and Vth2_L correspond to Vth1 and Vth2 in FIG. 13, respectively, and output operations do not change at all from those in the case of FIG. 11.

Accordingly, the comparing circuit 30 includes the threshold-voltage generating circuit 250 so that Vth1<Vth3_his<Vth2 is always satisfied.

Embodiment 3

Figure 20:
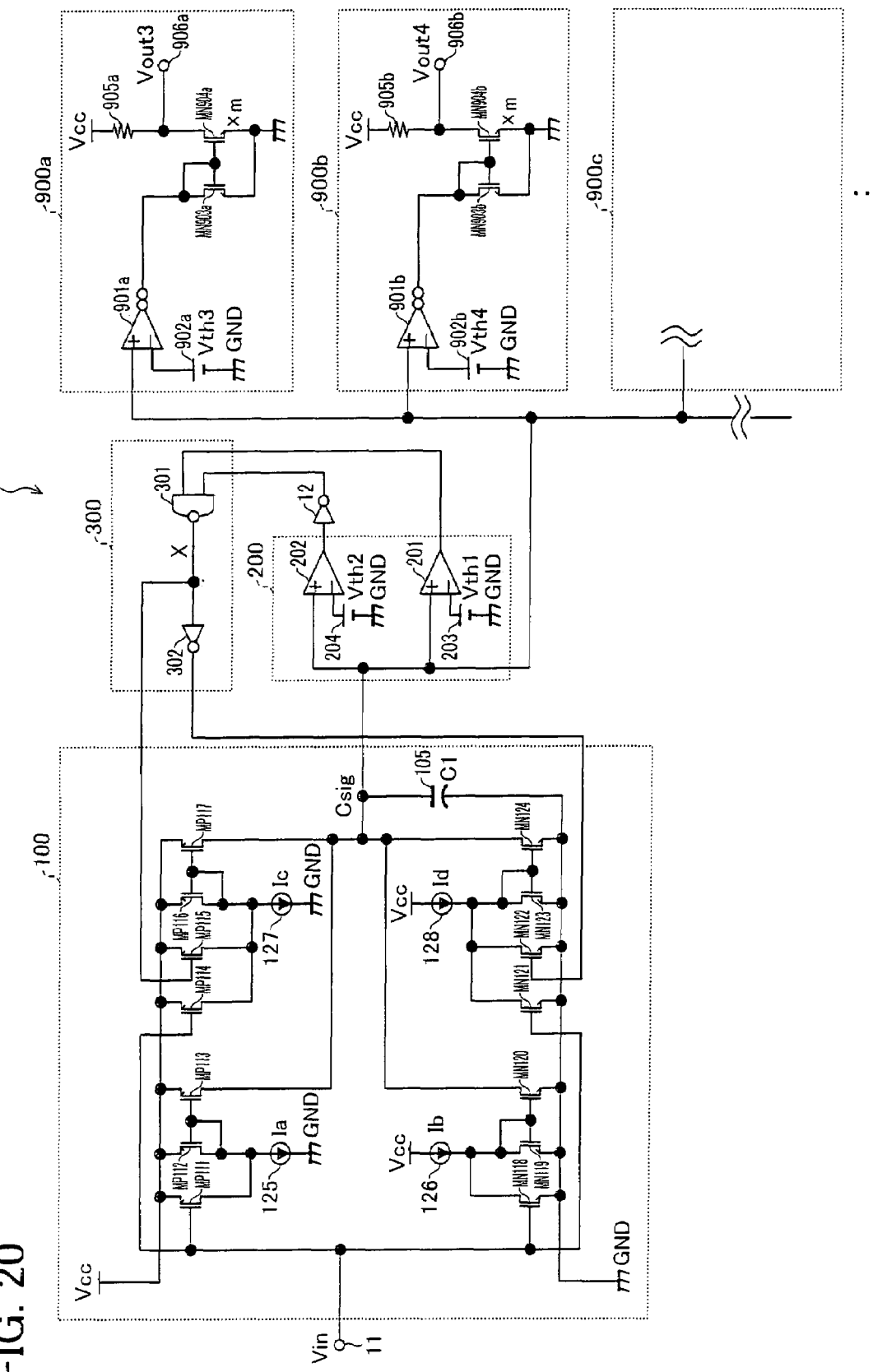
FIG. 20 is a circuit block diagram of a comparing circuit of another embodiment of the present invention.
Figure 21:
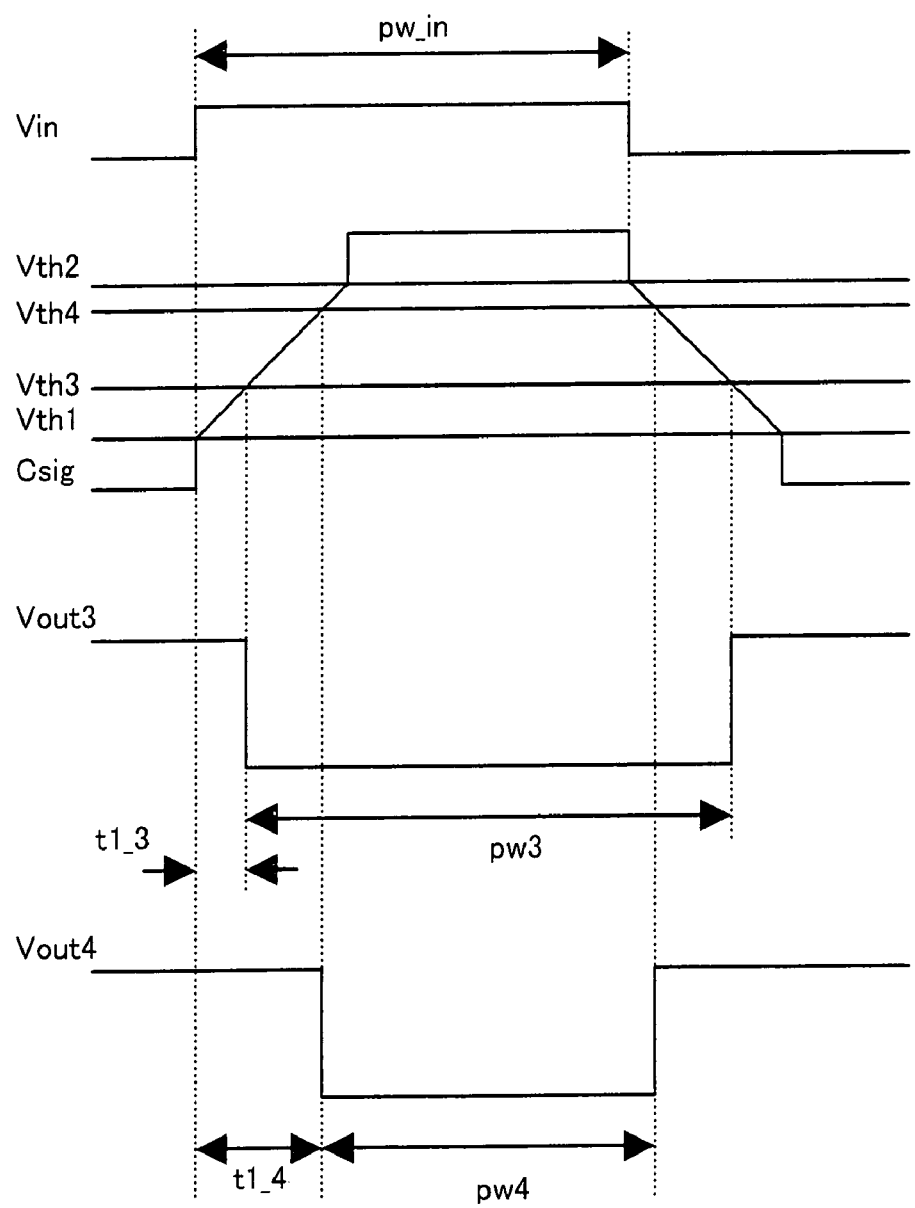
FIG. 21 is a timing chart showing waveforms in operations of the comparing circuit.

The following describes another embodiment of the present invention, with reference to FIGS. 20 and 21. Configurations other than those discussed in the present embodiment are same as those of Embodiments 1 and 2. For convenience in description, components having the same functions as those of the components shown in the figures of Embodiments 1 and 2 are given the same reference numerals, and description thereof is omitted. FIG. 20 is a circuit diagram showing an exemplary configuration of a comparing circuit 50.

The comparing circuit 50 of the present embodiment includes an input section 11, a NOT gate 12, a charging and discharging circuit 100, a comparator circuit 200, a logical operation circuit 300, and comparator output circuits 900a, 900b, .... Each of the comparator output circuits 900a and 900b is a third comparator circuit and an output-signal generating circuit.

The comparing circuit 50 of the present embodiment includes the comparator output circuits 900a, 900b, ... so that a plurality of threshold voltages (third threshold voltage (Vth3), fourth threshold voltage (Vth4), ...) between a first threshold voltage (Vth1) and a second threshold voltage (Vth2). On the basis of a result of comparison of a capacitor voltage Csig with the respective threshold voltages, an output voltage Vout (Vout3, Vout4, ...) is output.

The comparator output circuit 900a includes a comparator circuit section 901a, a reference power-source 902a to generate the threshold voltage Vth3, an MN903a, an MN904a, a resistor 905a, and an output section 906a. The comparator output circuit 900a does both comparing and outputting. The comparator circuit section 901a and the reference power-source 902a constitute the third comparator circuit defined in the Claims. The MN903a, the MN904a, the resistor 905a, and the output section 906a constitute the output-signal generating circuit defined in the Claims.

The comparator circuit section 901a has the same configuration as that of the comparator circuit section 701 of the comparing circuit 30. The MN903a, the MN904a, and the resistor 905a form the same configuration as that formed by the MN801, the MN802, and the resistor 803 of the comparing circuit 30. The comparator output circuits 900b, 900c, . . . each have the same configuration as that of the comparator output circuit 900a, except that a threshold voltage different from that of the comparator output circuit 900a is set.

The following describes operations of the comparator output circuits 900a and 900b of the comparing circuit 50 of the present embodiment, with reference to FIG. 21. The comparator output circuit 900a compares the capacitor voltage Csig with the threshold voltage Vth3. The comparator output circuit 900b compares the capacitor voltage Csig with the threshold voltage Vth4.

FIG. 21 shows waveforms in operations of the comparing circuit 50. In the figure, "pw_in" indicates an input pulse, "pw3" indicates an output pulse of the comparator output circuit 900a, and "pw4" indicates an output pulse of the comparator output circuit 900b. Further, "t1_3" indicates a delay time in the output pulse of the comparator output circuit 900a, which output pulse is responsive to a rise of the input pulse, and "t1_4" indicates a delay time in the output pulse of the comparator output circuit 900b, which output pulse is responsive to a rise of the input pulse.

The operations are basically the same as those of the comparing circuits 10 to 40 of the embodiments above. When Vin=High, the capacitor 105 is charged. When Vin=Low, the capacitor 105 is discharged.

The charging operation and the discharging operation of capacitor voltage Csig are same as those in the embodiments above. Note, however, that a plurality of threshold voltages are given so that a pulse signal (third pulse signal) is generated on the basis of a result of comparison of the capacitor voltage Csig with each of the threshold voltages, and supplied to the MN903a. Specifically, an output pulse of the output voltage Vout3 is obtained on the basis of a pulse signal based on the comparison of the capacitor voltage Csig with the threshold voltage Vth3. Further, the output pulse of the output voltage Vout4 is obtained on the basis of a pulse signal based on the comparison of the capacitor voltage Csig with the threshold voltage Vth4. Accordingly, a plurality of output pulses having a variety of pulse widths are obtainable. In other words, it is possible to change the output-pulse widths in a manner responsive to the values of the threshold voltages.

Further, as shown in FIG. 21, the delay times (t1_3, t1_4), besides the pulse widths, fluctuate in a manner responsive to the values of the threshold voltages. This allows the comparing circuit 50 of the present embodiment to be utilized as a delay circuit.

The plurality of threshold voltages set in the comparator output circuits 900a, 900b, . . . may or may not have a hysteresis characteristic. If the threshold voltages have a hysteresis characteristic, characteristics of preventing errors in outputs are improved, compared to a threshold voltage without a hysteresis characteristic.

Embodiment 4

Figure 22:
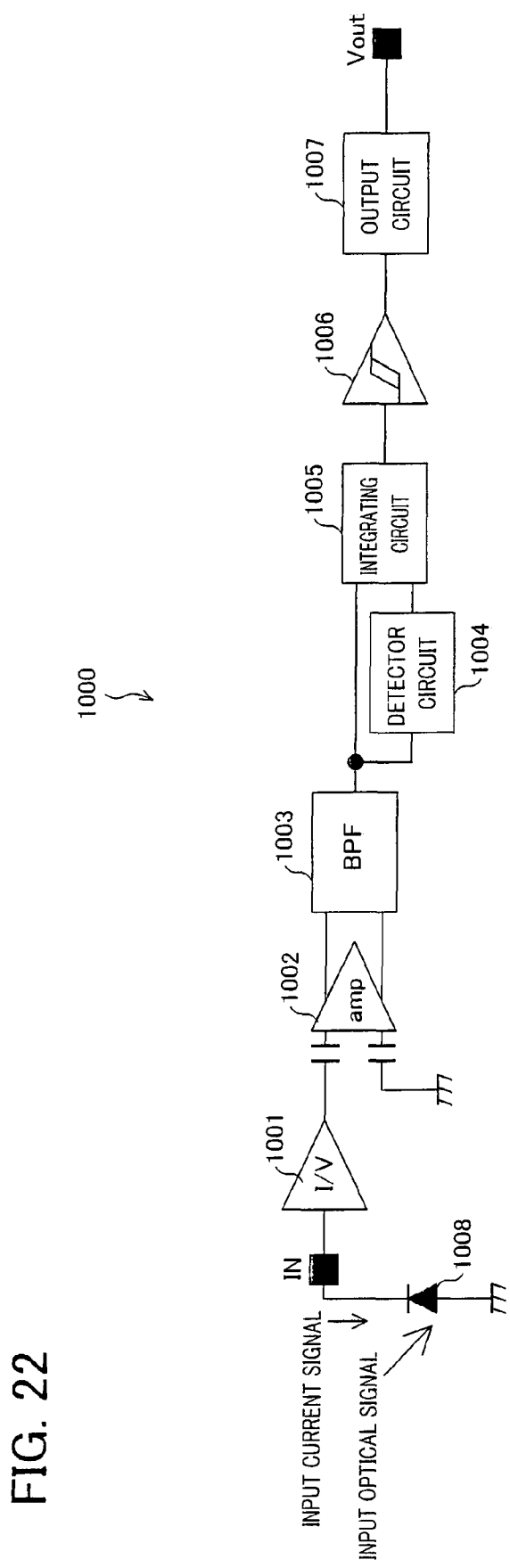
FIG. 22 is a block diagram of a remote control infrared receiver of an embodiment of the present invention.
Figure 23:
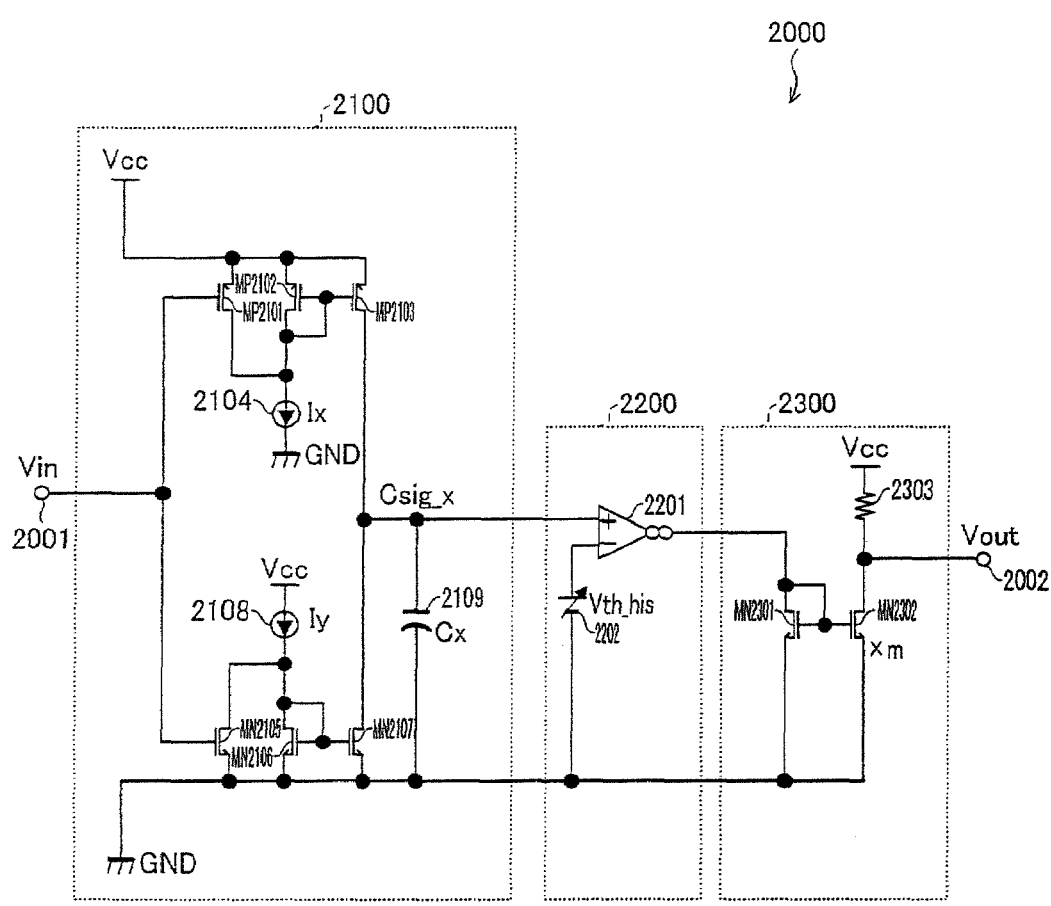
FIG. 23 is a circuit diagram of a comparing circuit employing a conventional hysteresis comparator circuit.

The following describes another embodiment of the present invention, with reference to FIG. 22. Configurations other than those discussed in the present embodiment are same as those of Embodiments 1 to 3. For convenience in description, components having the same functions as those of the components shown in the figures of Embodiments 1 to 3 are given the same reference numerals, and description thereof is omitted. FIG. 22 is a circuit block diagram showing an exemplary configuration of a remote control infrared receiver 1000.

The remote control infrared receiver 1000 of the present embodiment is an IC to be installed in a receiving chip of an infrared receiver (not illustrated) to process signals received. The rest of the non-illustrated portion of the infrared receiver is realizable with a conventional common configuration.

The remote control infrared receiver 1000 of the present embodiment includes an I/V converting circuit 1001, an amplifier circuit 1002, a band pass filter (BPF) 1003, a detector circuit 1004, an integrating circuit 1005, a hysteresis comparator circuit 1006, and an output circuit 1007. An input section of the remote control infrared receiver 1000 is connected to a photodiode 1008.

The hysteresis comparator circuit 1006 is constituted of the comparing circuits 10 to 50 of Embodiments 1 to 3. Employing a circuit having a hysteresis characteristic to be used as the comparing circuit allows improvement in capability of preventing errors.

Suppose that the infrared receiver is a remote control of a home appliance, for example. The remote control transmits an ASK (Amplitude Shift Keying) signal modulated by, normally, a predetermined carrier (subcarrier) of approximately 30 kHz to 60 kHz.

In the receiving chip, the photodiode 1008 receives an optical signal transmitted. When the photodiode 1008 receives the optical signal, an input current signal is generated. The I/V converting circuit 1001 converts the input current signal into a voltage signal. The amplifier circuit 1002 amplifies the voltage signal. Carrier components of the voltage signal supplied from the amplifier circuit 1002 are taken out by using a BPF 1003 for the frequencies of the carriers. The detector circuit 1004 detects the carrier. The integrating circuit 1005 integrates a time of the carriers. The hysteresis comparator circuit 1006 determines presence and absence of the carriers and outputs a signal. Specifically, the hysteresis comparator circuit 1006 compares the input voltage with the threshold voltage and outputs a signal. The output circuit 1007 performs an output process on the signal. Consequently, a digital signal is output.

In a case of IrDA devices, a signal transmitted is not modulated. Therefore, no band pass filter circuit is necessary. However, configurations of IrDA devices are almost same as that of the remote control infrared receiver 1000.

The remote control infrared receiver 1000 of the present embodiment and an infrared receiver including the remote control infrared receiver 1000 both include the hysteresis comparator circuit 1006 constituted of the comparing circuit of the present invention. This makes it possible to maintain capability of preventing errors, and at the same time, to improve in capability of outputting a pulse having a same period as that of an input pulse having a short pause period.

In recent years, to speed up transmission or to drive at low power-consumption, infrared remote control systems employing transmission codes of short periods and short pulse widths have been increasingly installed in multimedia devices such as wireless keyboards.

In response to this circumstance, the infrared receiver of the present embodiment includes a comparing circuit of the present invention so that it is possible to maintain capability of preventing errors, and at the same time, to receive a transmission code with a short pause period or a transmission code with a short pulse width. This allows the infrared receiver to be responsive to the devices mentioned above.

The present invention is not limited to the description of the embodiments above, but may be altered by a skilled person within the scope of the claims. An embodiment based on a proper combination of technical means disclosed in different embodiments is encompassed in the technical scope of the present invention.

The present invention is applicable to devices employing infrared communications means. An example of the devices is an infrared communication receiver. More concretely, the present invention is applicable to multimedia devices such as a remote control of home appliances and a wireless keyboard.

As described above, in the comparing circuit of the present invention, the first comparator circuit compares the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage. The first comparator circuit supplies, when the capacitor-voltage becomes higher than the second threshold voltage in charging the capacitor, the output-signal generating circuit with the first pulse-signal to switch a level of the output pulse-signal between a High-level and a Low-level. The first comparator circuit supplies, when the capacitor-voltage becomes lower than the first threshold voltage in discharging the capacitor, the output-signal generating circuit with the first pulse-signal to switch the level of the output pulse-signal between the High-level and the Low-level. The comparing circuit includes current-value adjusting means for adjusting a value of the charging current and a value of the discharging current of the charging and discharging circuit by generating a signal that is based on the first pulse-signal and is to adjust the value of the charging current and the value of the discharging current, and supplying the charging and discharging circuit with the signal thus generated.

Accordingly, the level of the output pulse-signal is switched between the High-level and the Low-level in the output-signal generating circuit on the basis of the first pulse-signal supplied from the first comparator circuit. The current-value adjusting means generates a signal that is based on the first pulse-signal supplied from the first comparator circuit is to adjust the value of the charging current and the value of the discharging current of the charging and discharging circuit, and supplies the charging and discharging circuit with the signal thus generated. As a result, in the charging and discharging circuit, the value of the charging current and the value of the discharging current are adjusted, and the charging period and the discharging period are adjusted. With the charging period and the discharging period being adjusted in the charging and discharging circuit, the first comparator circuit compares the capacitor-voltage with the first threshold voltage and the capacitor-voltage with the second threshold voltage, generates the first pulse-signal, and supplies the output-signal generating circuit with the first pulse-signal. By this way, the level of the output pulse-signal is switched between the High-level and the Low-level at an interval at which the first pulse-signal is output in the case with the charging period and the discharging period being adjusted in the charging and discharging circuit. Thus, if the charging period and the discharging period are shortened, then the level of the output pulse-signal is switched between the High-level and the Low-level at a rapid interval.

Further, when the first comparator circuit outputs the first pulse-signal responsive to the case in which the capacitor-voltage is between the first threshold voltage and the second threshold voltage, inclusive, the value of the charging current and the value of the discharging current are adjusted to be reduced in the charging and discharging circuit, thereby setting the charging period and the discharging period long. Thus, even if the input pulse is split, the capacitor-voltage does not become lower than the first threshold voltage. Thus, the output pulse is output normally.

The foregoing configuration produces an advantage to provide a comparing circuit that maintains capability of preventing errors, and at the same time, improves in capability of outputting a pulse having a same period as that of an input pulse having a short pause period.

Further, in the comparing circuit of the present invention, the first comparator circuit compares the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage. The second comparator circuit compares the capacitor-voltage with a third threshold voltage, which is higher than the first threshold voltage and lower than the second threshold voltage, to generate the second pulse-signal responsive to either of (a) a case in which the capacitor-voltage is lower than the third threshold voltage and (b) a case in which the capacitor-voltage is higher than the third threshold voltage. The second comparator circuit supplies, when the capacitor-voltage becomes higher than the third threshold voltage in charging the capacitor, the output-signal generating circuit with the second pulse-signal to switch a level of the output pulse-signal between a High-level and a Low-level. The second comparator circuit supplies, when the capacitor-voltage becomes lower than the third threshold voltage in discharging the capacitor, the output-signal generating circuit with the second pulse-signal to switch the level of the output pulse-signal between the High-level and the Low-level. The comparing circuit includes current-value adjusting means for adjusting a value of the charging current and a value of the discharging current of the charging and discharging circuit by generating a signal that is based on a first pulse-signal and is to adjust the value of the charging current and the value of the discharging current, and supplying the charging and discharging circuit with the signal thus generated.

Accordingly, in response to the second pulse-signal supplied from the second comparator circuit, the level of the output pulse-signal is switched between the High-level and the Low-level in the output-signal generating circuit. Further, the current-value adjusting means generates a signal that is based on the first pulse-signal supplied from the first comparator circuit and is to adjust the value of the charging current and the value of the discharging current of the charging and discharging circuit, and supplies the charging and discharging circuit with the signal. As a result, in the charging and discharging circuit, the value of the charging current and the value of the discharging current are adjusted, and the charging period and the discharging period are adjusted. With the charging period and the discharging period being adjusted in the charging and discharging circuit, the second comparator circuit compares the capacitor-voltage with the third threshold voltage, generates the second pulse-signal, and supplies the output-signal generating circuit with the second pulse-signal. The level of the output pulse-signal is switched between the High-level and the Low-level at an interval at which the second pulse-signal is output in the case with the charging period and the discharging period being adjusted in the charging and discharging circuit. Thus, if the charging period and the discharging period are shortened, then the level of the output pulse-signal is switched between the High-level and the Low-level at a rapid interval.

Further, the second comparator circuit compares the capacitor-voltage with the third threshold voltage and generates the second pulse-signal. The time when the capacitor-voltage becomes higher than the third threshold voltage becomes fast, so that the level of the output pulse-signal switches more rapidly between the High-level and the Low-level.

Further, when the first comparator circuit outputs the first pulse-signal responsive to the case in which the capacitor-voltage is between the first threshold voltage and the second threshold voltage, inclusive, the value of the charging current and the value of the discharging current are adjusted to be reduced in the charging and discharging circuit, thereby setting the charging period and the discharging period long. Thus, even if the input pulse is split, the capacitor-voltage does not become lower than the third threshold voltage. Thus, the output pulse is output normally.

The foregoing configuration produces an advantage to provide a comparing circuit that maintains capability of preventing errors, and at the same time, improves in capability of outputting a pulse having a same period as that of an input pulse having a short pause period, and furthermore, also improves in responsiveness to an input pulse having a short period and a short pulse-width.

Further, in the comparing circuit of the present invention, the first comparator circuit compares the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage. The plurality of third comparator circuits, for each of which a threshold voltage higher than the first threshold voltage and lower than the second threshold voltage is set individually, compares the capacitor-voltage with the threshold voltage to generate the third pulse-signal responsive to either of (a) a case in which the capacitor-voltage is lower than the threshold voltage and (b) a case in which the capacitor-voltage is higher than the threshold voltage. The plurality of third comparator circuits individually supplies, when the capacitor-voltage becomes higher than the threshold voltage in charging the capacitor, the output-signal generating circuit with the third pulse-signal to switch a level of the output pulse-signal between a High-level and a Low-level. The plurality of third comparator circuits individually supplies, when the capacitor-voltage becomes lower than the threshold voltage in discharging the capacitor, the output-signal generating circuit with the third pulse-signal to switch the level of the output pulse-signal between the High-level and the Low-level. The comparing circuit includes current-value adjusting means for adjusting a value of the charging current and a value of the discharging current of the charging and discharging current by generating a signal that is based on a first pulse-signal and is to adjust the value of the charging current and the value of the discharging current of the charging and discharging circuit, and supplying the charging and discharging circuit with the signal thus generated.

Accordingly, the level of the output pulse-signal is switched between the High-level and the Low-level in the output-signal generating circuit on the basis of the third pulse-signal supplied from the third comparator circuit. The current-value adjusting means generates the signal that is based on the first pulse-signal supplied from the first comparator circuit and is to adjust the value of the charging current and the value of the discharging current of the charging and discharging circuit, and supplies the charging and discharging circuit with the signal. As a result, in the charging and discharging circuit, the value of the charging current and the value of the discharging current is adjusted, and the charging period and the discharging period are adjusted. Then, with the charging period and the discharging period being adjusted in the charging and discharging circuit, the third comparator circuit compares the capacitor-voltage with the respective threshold voltages, generates the third pulse-signal, and supplies the output-signal generating circuit with the third pulse-signal. Therefore, the level of the output pulse-signal is switched between the High-level and the Low-level at an interval at which the third pulse-signal is output in the case with the charging period and the discharging period being adjusted in the charging and discharging circuit. Thus, if the charging period and the discharging period are shortened, then the level of the output pulse-signal is switched between the High-level and the Low-level at a rapid interval.

Further, with the plurality of third comparator circuit being provided, output pulses with different pulse widths are supplied individually to the output-signal generating circuit on the basis of results of comparisons of the capacitor-voltage with the respective threshold voltages. Therefore, output pulses with different pulse-widths are output, which pulse widths are changed in a manner that depends on the different threshold voltages.

Further, when the first comparator circuit outputs the first pulse-signal responsive to the case in which the capacitor-voltage is between the first threshold voltage and the second threshold voltage, inclusive, the value of the charging current and the value of the discharging current to reduce the charging current and the discharging current are adjusted to be reduced in the charging and discharging circuit, thereby setting the charging period and the discharging period long. Thus, even if the input pulse is split, the capacitor-voltage does not become lower than the threshold voltage. Thus, the output pulse is output normally.

The foregoing configuration produces an advantage to provide a comparing circuit that maintains capability of preventing errors, and at the same time, improves in capability of outputting a pulse having a same period as that of an input pulse having a short pause period. Furthermore, with the comparing circuit, an output pulse having a desired pulse-width or a desired delay-time becomes obtainable.

Further, it is preferable in the comparing circuit of the present invention that the charging and discharging circuit include a switching section switching in response to the switch in level of the input pulse signal between the High-level and the Low-level, the switching section causing a first current-source supplying the charging current and a second current-source supplying the discharging current to be switched so that the capacitor is charged and discharged.

With this configuration, the charging and discharging circuit includes the switching section that switches in response to the switch in the level of the input pulse signal between the High-level and the Low-level. The switching section causes the first current-source supplying the charging current and the second current-source supplying the discharging current to be switched so that the capacitor is charged and discharged. This makes it possible to switch alternately a charging operation and a discharging operation.

Further, it is preferable in the comparing circuit of the present invention that a charging period and a discharging period in the charging and discharging circuit be same during a period in which the first comparator circuit outputs the first pulse-signal responsive to the case in which the capacitor voltage is between the first threshold voltage and the second threshold voltage, inclusive.

With this configuration, the charging period and the discharging period in the charging and discharging circuit are same during the period in which the first comparator circuit outputs the first pulse-signal responsive to the case in which the capacitor voltage is between the first threshold voltage and the second threshold voltage, inclusive. This results in that the pulse signals are supplied to the output-signal generating circuit at a same interval. Thus, an output pulse having a same pulse-width as that of an input pulse becomes obtainable.

Further, it is preferable that the comparing circuit of the present invention further include an initializing circuit to give an initial setting to the capacitor-voltage of the charging and discharging circuit when a power source is given.

With this configuration, the initializing circuit is provided so that it becomes possible that the initializing circuit gives an initial setting to the capacitor-voltage of the charging and discharging circuit. For example, it becomes possible to set the capacitor-voltage to 0. Therefore, it becomes possible for the circuit to operate stably, i.e. to process waveforms stably, when the power source is given.

Further, it is preferable in the comparing circuit of the present invention that each of the first threshold voltage and the second threshold voltage be generated by utilizing a voltage drop in a resistor. With the foregoing, the first threshold voltage and the second threshold voltage are generated by utilizing a voltage drop in a resistor. This makes it possible to always satisfy a voltage being set without being affected by fluctuations in processes or variations in devices. For example, it becomes possible to generate the first threshold voltage and the second threshold voltage, which is higher than the first threshold voltage.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A comparing circuit, comprising:
    a charging and discharging circuit to charge a capacitor with charging current and discharge the capacitor with discharging current by switching alternately between a charging operation and a discharging operation in response to a switch in level of an input pulse signal between a High-level and a Low-level;
    a first comparator circuit to compare a capacitor-voltage of the capacitor with a predetermined threshold voltage;
    an output-signal generating circuit to generate and output an output pulse-signal based on a first pulse-signal supplied from the first comparator circuit; and
    current-value adjusting means for adjusting a value of the charging current and a value of the discharging current of the charging and discharging circuit by generating a signal that is based on the first pulse-signal and is to adjust the value of the charging current and the value of the discharging current, and supplying the charging and discharging circuit with the signal thus generated,
    the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage,
    the first comparator circuit supplying, when the capacitor-voltage becomes higher than the second threshold voltage in charging the capacitor, the output-signal generating circuit with the first pulse-signal to switch a level of the output pulse-signal between a High-level and a Low-level, and
    the first comparator circuit supplying, when the capacitor-voltage becomes lower than the first threshold voltage in discharging the capacitor, the output-signal generating circuit with the first pulse-signal to switch the level of the output pulse-signal between the High-level and the Low-level.

2. The circuit of claim 1, wherein the charging and discharging circuit includes a switching section switching in response to the switch in level of the input pulse signal between the High-level and the Low-level,
    the switching section causing a first current-source supplying the charging current and a second current-source supplying the discharging current to be switched so that the capacitor is charged and discharged.

3. The circuit of claim 1, wherein a charging period and a discharging period in the charging and discharging circuit are same during a period in which the first comparator circuit outputs the first pulse-signal responsive to the case in which the capacitor voltage is between the first threshold voltage and the second threshold voltage, inclusive.

4. The circuit of claim 1, further comprising an initializing circuit to give an initial setting to the capacitor-voltage of the charging and discharging circuit when a power source is given.

5. The circuit of claim 1, wherein each of the first threshold voltage and the second threshold voltage is generated by utilizing a voltage drop in a resistor.

6. A comparing circuit, comprising:
    a charging and discharging circuit to charge a capacitor with charging current and discharge the capacitor with discharging current by switching alternately between a charging operation and a discharging operation in response to a switch in level of an input pulse signal between a High-level and a Low-level;
    a first comparator circuit and a second comparator circuit, each of which is to compare a capacitor-voltage of the capacitor with a predetermined threshold voltage;

an output-signal generating circuit to generate and output an output pulse-signal based on a second pulse-signal supplied from the second comparator circuit; and current-value adjusting means for adjusting a value of the charging current and a value of the discharging current of the charging and discharging circuit by generating a signal that is based on a first pulse-signal and is to adjust the value of the charging current and the value of the discharging current, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the second comparator circuit comparing the capacitor-voltage with a third threshold voltage, which is higher than the first threshold voltage and lower than the second threshold voltage, to generate the second pulse-signal responsive to either of (a) a case in which the capacitor-voltage is lower than the third threshold voltage and (b) a case in which the capacitor-voltage is higher than the third threshold voltage, the second comparator circuit supplying, when the capacitor-voltage becomes higher than the third threshold voltage in charging the capacitor, the output-signal generating circuit with the second pulse-signal to switch a level of the output pulse-signal between a High-level and a Low-level, and the second comparator circuit supplying, when the capacitor-voltage becomes lower than the third threshold voltage in discharging the capacitor, the output-signal generating circuit with the second pulse-signal to switch the level of the output pulse-signal between the High-level and the Low-level.

7. The circuit of claim 6, wherein the charging and discharging circuit includes a switching section switching in response to the switch in level of the input pulse signal between the High-level and the Low-level, the switching section causing a first current-source supplying the charging current and a second current-source supplying the discharging current to be switched so that the capacitor is charged and discharged.

8. The circuit of claim 6, wherein a charging period and a discharging period in the charging and discharging circuit are same during a period in which the first comparator circuit outputs the first pulse-signal responsive to the case in which the capacitor voltage is between the first threshold voltage and the second threshold voltage, inclusive.

9. The circuit of claim 6, further comprising an initializing circuit to give an initial setting to the capacitor-voltage of the charging and discharging circuit when a power source is given.

10. The circuit of claim 6, wherein each of the first threshold voltage and the second threshold voltage is generated by utilizing a voltage drop in a resistor.

11. A comparing circuit, comprising:

a charging and discharging circuit to charge a capacitor with charging current and discharge the capacitor with discharging current by switching alternately between a charging operation and a discharging operation in response to a switch in level of an input pulse signal between a High-level and a Low-level;

a first comparator circuit to compare a capacitor-voltage of the capacitor with a predetermined threshold voltage, and a plurality of third comparator circuits, each of which is to compare the capacitor-voltage of the capacitor with a predetermined threshold voltage;

a plurality of output-signal generating circuits, each of which is to individually generate and output an output pulse-signal based on a third pulse-signal supplied individually from the plurality of third comparator circuits; and current-value adjusting means for adjusting a value of the charging current and a value of the discharging current of the charging and discharging current by generating a signal that is based on a first pulse-signal and is to adjust the value of the charging current and the value of the discharging current of the charging and discharging circuit, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the plurality of third comparator circuits, for each of which a threshold voltage higher than the first threshold voltage and lower than the second threshold voltage is set individually, comparing the capacitor-voltage with the threshold voltage to generate the third pulse-signal responsive to either of (a) a case in which the capacitor-voltage is lower than the threshold voltage and (b) a case in which the capacitor-voltage is higher than the threshold voltage, the plurality of third comparator circuits individually supplying, when the capacitor-voltage becomes higher than the threshold voltage in charging the capacitor, the output-signal generating circuit with the third pulse-signal to switch a level of the output pulse-signal between a High-level and a Low-level, and the plurality of third comparator circuits individually supplying, when the capacitor-voltage becomes lower than the threshold voltage in discharging the capacitor, the output-signal generating circuit with the third pulse-signal to switch the level of the output pulse-signal between the High-level and the Low-level.

12. The circuit of claim 11, wherein the charging and discharging circuit includes a switching section switching in response to the switch in level of the input pulse signal between the High-level and the Low-level, the switching section causing a first current-source supplying the charging current and a second current-source supplying the discharging current to be switched so that the capacitor is charged and discharged.

13. The circuit of claim 11, wherein a charging period and a discharging period in the charging and discharging circuit are same during a period in which the first comparator circuit outputs the first pulse-signal responsive to the case in which the capacitor voltage is between the first threshold voltage and the second threshold voltage, inclusive.

14. The circuit of claim 11, further comprising an initializing circuit to give an initial setting to the capacitor-voltage of the charging and discharging circuit when a power source is given.

15. The circuit of claim 11, wherein each of the first threshold voltage and the second threshold voltage is generated by utilizing a voltage drop in a resistor.

16. An infrared receiver, comprising a comparing circuit provided at an end, via which an output is made, of a circuit receiving a signal processing the signal to allow the signal to be used within the infrared receiver, and outputting the signal to prevent errors, the comparing circuit comprising:

a charging and discharging circuit to charge a capacitor with charging current and discharge the capacitor with discharging current by switching alternately between a charging operation and a discharging operation in response to a switch in level of an input pulse signal between a High-level and a Low-level;

a first comparator circuit to compare a capacitor-voltage of the capacitor with a predetermined threshold voltage;

an output-signal generating circuit to generate and output an output pulse-signal based on a first pulse-signal supplied from the first comparator circuit; and current-value adjusting means for adjusting a value of the charging current and a value of the discharging current of the charging and discharging circuit by generating a signal that is based on the first pulse-signal and is to adjust the value of the charging current and the value of the discharging current, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the first comparator circuit supplying, when the capacitor-voltage becomes higher than the second threshold voltage in charging the capacitor, the output-signal generating circuit with the first pulse-signal to switch a level of the output pulse-signal between a High-level and a Low-level, and the first comparator circuit supplying, when the capacitor-voltage becomes lower than the first threshold voltage in discharging the capacitor, the output-signal generating circuit with the first pulse-signal to switch the level of the output pulse-signal between the High-level and the Low-level.

17. An infrared receiver, comprising a comparing circuit provided at an end, via which an output is made, of a circuit receiving a signal processing the signal to allow the signal to be used within the infrared receiver, and outputting the signal to prevent errors, the comparing circuit comprising:

a charging and discharging circuit to charge a capacitor with charging current and discharge the capacitor with discharging current by switching alternately between a charging operation and a discharging operation in response to a switch in level of an input pulse signal between a High-level and a Low-level;

a first comparator circuit and a second comparator circuit, each of which is to compare a capacitor-voltage of the capacitor with a predetermined threshold voltage;

an output-signal generating circuit to generate and output an output pulse-signal based on a second pulse-signal supplied from the second comparator circuit; and current-value adjusting means for adjusting a value of the charging current and a value of the discharging current of the charging and discharging circuit by generating a signal that is based on a first pulse-signal and is to adjust the value of the charging current and the value of the discharging current, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the second comparator circuit comparing the capacitor-voltage with a third threshold voltage, which is higher than the first threshold voltage and lower than the second threshold voltage, to generate the second pulse-signal responsive to either of (a) a case in which the capacitor-voltage is lower than the third threshold voltage and (b) a case in which the capacitor-voltage is higher than the third threshold voltage, the second comparator circuit supplying, when the capacitor-voltage becomes higher than the third threshold voltage in charging the capacitor, the output-signal generating circuit with the second pulse-signal to switch a level of the output pulse-signal between a High-level and a Low-level, and the second comparator circuit supplying, when the capacitor-voltage becomes lower than the third threshold voltage in discharging the capacitor, the output-signal generating circuit with the second pulse-signal to switch the level of the output pulse-signal between the High-level and the Low-level.

18. An infrared receiver, comprising a comparing circuit provided at an end, via which an output is made, of a circuit receiving a signal processing the signal to allow the signal to be used within the infrared receiver, and outputting the signal to prevent errors, the comparing circuit comprising:

a charging and discharging circuit to charge a capacitor with charging current and discharge the capacitor with discharging current by switching alternately between a charging operation and a discharging operation in response to a switch in level of an input pulse signal between a High-level and a Low-level;

a first comparator circuit to compare a capacitor-voltage of the capacitor with a predetermined threshold voltage, and a plurality of third comparator circuits, each of which is to compare the capacitor-voltage of the capacitor with a predetermined threshold voltage;

a plurality of output-signal generating circuits, each of which is to individually generate and output an output pulse-signal based on a third pulse-signal supplied individually from the plurality of third comparator circuits; and current-value adjusting means for adjusting a value of the charging current and a value of the discharging current of the charging and discharging current by generating a signal that is based on a first pulse-signal and is to adjust the value of the charging current and the value of the discharging current of the charging and discharging circuit, and supplying the charging and discharging circuit with the signal thus generated, the first comparator circuit comparing the capacitor-voltage with a first threshold voltage and the capacitor-voltage with a second threshold voltage, which is higher than the first threshold voltage, to generate the first pulse-signal responsive to one of (a) a case in which the capacitor-voltage is lower than the first threshold voltage, (b) a case in which the capacitor-voltage is between the first threshold voltage and the second threshold voltage, inclusive, and (c) a case in which the capacitor-voltage is higher than the second threshold voltage, the plurality of third comparator circuits, for each of which a threshold voltage higher than the first threshold voltage and lower than the second threshold voltage is set individually, comparing the capacitor-voltage with the threshold voltage to generate the third pulse-signal responsive to either of (a) a case in which the capacitor-voltage is lower than the threshold voltage and (b) a case in which the capacitor-voltage is higher than the threshold voltage, the plurality of third comparator circuits individually supplying, when the capacitor-voltage becomes higher than the threshold voltage in charging the capacitor, the output-signal generating circuit with the third pulse-signal to switch a level of the output pulse-signal between a High-level and a Low-level, and the plurality of third comparator circuits individually supplying, when the capacitor-voltage becomes lower than the threshold voltage in discharging the capacitor, the output-signal generating circuit with the third pulse-signal to switch the level of the output pulse-signal between the High-level and the Low-level.

* * * * *